United States Patent
Nakagawa

(10) Patent No.: US 6,426,501 B1
(45) Date of Patent: Jul. 30, 2002

(54) DEFECT-REVIEW SEM, REFERENCE SAMPLE FOR ADJUSTMENT THEREOF, METHOD FOR ADJUSTMENT THEREOF, AND METHOD OF INSPECTING CONTACT HOLES

(75) Inventor: Seiichi Nakagawa, Tokyo (JP)

(73) Assignee: Jeol Ltd., Tokyo (JP)

( * ) Notice: Subject to any disclaimer, the term of this patent is extended or adjusted under 35 U.S.C. 154(b) by 0 days.

(21) Appl. No.: 09/321,219

(22) Filed: May 27, 1999

(30) Foreign Application Priority Data

May 27, 1998 (JP) .......................................... 10-145591

(51) Int. Cl.[7] ............................................. H01J 37/256
(52) U.S. Cl. ..................................... 250/310; 250/252.1
(58) Field of Search ........................... 250/252.1, 491.1, 250/442.11, 440.11, 310, 306, 307

(56) References Cited

U.S. PATENT DOCUMENTS

| | | | |
|---|---|---|---|
| 5,389,787 A | 2/1995 | Todokoro et al. ........... 250/310 |
| 5,502,306 A | 3/1996 | Meisburger et al. ........ 250/310 |
| 5,665,968 A | 9/1997 | Meisburger et al. ........ 250/310 |
| 5,717,204 A | 2/1998 | Mesiburger et al. ........ 250/310 |
| 5,736,742 A | * 4/1998 | Ochiai ........................ 250/396 |
| 5,789,748 A | * 8/1998 | Liu et al. .................... 250/310 |
| 5,990,567 A | * 11/1999 | Tseng et al. ................ 257/797 |
| 6,204,509 B1 | * 3/2001 | Yahiro et al. ............ 250/491.1 |
| 6,225,628 B1 | * 5/2001 | Iwabuchi et al. ........... 250/310 |

* cited by examiner

*Primary Examiner*—Kiet T. Nguyen
(74) *Attorney, Agent, or Firm*—Webb Ziesenheim Logsdon Orkin & Hanson, P.C.

(57) ABSTRACT

There is disclosed a defect-review SEM (scanning electron microscope) and method for inspecting contact holes having small aperture diameters (e.g., less than 0.05 μm) and high aspect ratios (e.g., 10 to 15) for defects with high throughput. An angular aperture control lens interlocks with an objective lens to control the convergence angle of the electron beam incident on a wafer sample to a small value (e.g., $10^{-5}$ to $10^{-6}$ rad). The beam is scanned across the sample by an upper-stage deflector and a lower-stage deflector. The beam is scanned in two stages to scan the surface of the sample vertically. The resulting secondary electrons or backscattered electrons are detected by a detector located near the back focal point of the objective lens.

16 Claims, 18 Drawing Sheets

DEFECT-REVIEW SEM, REFERENCE SAMPLE FOR ADJUSTMENT THEREOF, METHOD FOR ADJUSTMENT THEREOF, AND METHOD OF INSPECTING CONTACT HOLES

FIELD OF THE INVENTION

The present invention relates to a defect-review SEM (scanning electron microscope) best adapted to inspect contact holes formed during fabrication of semiconductor devices.

DESCRIPTION OF THE PRIOR ART

It is quite important to enhance the yield in fabricating semiconductor devices. It is known that factors deteriorating the manufacturing yield include random factors and process factors.

Random factors are associated with various semiconductor process factors concerned with semiconductor fabrication environments, such as the cleanliness of the cleanroom, generation of dust from the wafer conveyance system and from steppers, removal of substances peeled from etchers, and insufficient washing by wafer cleaning equipment. Therefore, the random factors are uncertain and attributed to dust produced by factors that are difficult to forecast.

Process factors are produced by deviations of actually fabricated patterns and structures from ideal chip linewidths, chip arrays, and chip structures based on semiconductor designs. To solve the problems of the process factors, tools for inspecting patterned wafers are installed in semiconductor cleanrooms for individual process steps.

Among inspections of the process factors, inspections of contact holes have attracted attention recently. For these inspections, optical inspection systems and defect-review SEMs have been developed.

An optical inspection system can inspect dust, foreign matter, and defective metallization patterns up to a feature size of 0.2 $\mu$m by various methods. For example, scattering of light is employed. In another method, an electrical signal is obtained by detection of light and passed through a spatial filter to process the information. In a further method, features are extracted from optical images by pattern matching. In recent years, inspection equipment capable of inspecting contact holes having diameters of 0.1 to 0.05 $\mu$m has been announced and attracted attention. However, the minimum contact hole diameter which can be inspected precisely is not obvious in practice.

Users utilize wafer pattern dimension metrology and inspection tools that are normally used to inspect contact holes using an electron beam. In this case, it has been reported that aspect ratios of about 3 to 5 could be inspected at a diameter of 0.2 $\mu$m. However, defective apertures of contact holes smaller than 0.2 $\mu$m and having aspect ratios of 10 to 15 cannot be inspected.

In recent years, a dedicated contact hole inspection system capable of inspecting contact holes having diameters of up to 0.1 $\mu$m by sharply focusing the electron beam of a scanning electron microscope has been developed.

FIG. 1 schematically shows this inspection system having an electron gun (not shown) emitting an electron beam 1 that is accelerated. The beam 1 is sharply focused onto a semiconductor wafer sample 3 having a diameter of 8 to 12 inches by an electromagnetic lens 2. The beam is scanned by an electromagnetic deflector 4. A negative bias voltage (e.g., 19 kV) is applied to the sample to decelerate the beam down to 0.5 to 1.5 kV. The beam 1 is focused by the electromagnetic lens 2 to a diameter of less than 0.05 $\mu$m on a pattern formed on the wafer sample 3.

The electromagnetic deflector 4 scans the electron beam 1 across the pattern on the sample 3 at a high rate in the direction indicated by the arrow. The broken line indicates the state during the blanking period of the electron beam. The deflector 4 scans the electron beam across 512 pixels in one excursion, 100 MHz per pixel.

The sample 3 is placed on a stage 5. The velocity of movement of the stage 5 and its position are controlled at an accuracy of tens of nanometers, using a linear encoder or a laser interferometer.

Because the sample 3 is irradiated with the electron beam 1, secondary electrons having energies from 0 to less than 10 eV are produced. Since a bias voltage is applied between the sample 3 and the electromagnetic lens 2, the secondary electrons are accelerated to 19 keV and enter a Wien filter (not shown) mounted over the electromagnetic lens 2. This filter does not deflect the incident electron beam 1 but deflects the secondary electrons from the sample through about 90°.

The secondary electrons deflected by the Wien filter are detected by a secondary electron detector 6. A Schottky barrier diode detector that is a high-speed secondary electron detector responding at 100 MHz per pixel is used as the detector 6. An amplifier 7 amplifies the signal at a response frequency of 100 MHz.

The output signal from the amplifier 7 is supplied to an A/D converter 8 and converted into a digital signal. The output signal from the A/D converter 8 is fed to a signal distributor 9. The stage 5 is continuously moved in the Y-direction. The electron beam 1 is scanned only in the X-direction perpendicular to the Y-direction. The resulting signal representing 512×512 pixels provides a SWATH image in synchronism with a sync signal from the linear encoder or laser interferometer in the control system for the beam deflector 4 and for the stage 5. The SWATH image is distributed to plural high-speed image processing circuit boards 10.

Each of the high-speed image processing circuit boards 10 has an image distributor 11, an image memory 12, a defect feature extractor 13, and a defect detector 14. The image distributor 11 stores the SWATH images in the image memory 12 according to given image position information. The SWATH images are collected at the timing of image collection in synchronism with the sync signal from the linear encoder or laser interferometer in the control system for the beam deflector 4 and for the stage 5.

The defect feature extractor 13 is loaded with an algorithm specialized by the signal stored in the image memory 12. Features of the image are extracted according to the signal stored in the image memory 12 in accordance with the algorithm. The defect detector 14 compares defect features of two images extracted in succession (cell comparison) or compares different chip patterns (die comparison). Alternatively, the detector compares defect features with CAD design data about a chip pattern already collected from good products or chip patterns (data comparison). Defect sizes and their coordinates are detected by a specially prepared algorithm.

A defect inspection result processor 15 integrates defect sizes, coordinates, and wafer information (e.g., wafer names, lot numbers, and wafer recipe) processed in parallel at high speed by the high-speed image processing circuit boards 10 and stores the results.

The defect inspection system shown in FIG. 1 has been developed only to focus the electron beam of the prior art scanning electron microscope as finely as possible. Therefore, where a contact hole not only has a small aperture diameter but also has a much larger depth than the aperture diameter, difficulties take place. For example, it is impossible to detect a contact hole with defective aperture if the aperture diameter is less than 0.05 μm and the aspect ratio is 10 to 15.

If a contact hole in $SiO_2$ film formed on a silicon (Si) substrate or a contact hole in a resist film is inspected with an electron beam, the accelerating voltage of the electron beam incident on the sample is set less than 1 kV where the secondary electron emission rate $\delta \geq 1$ to avoid charging of the oxide film or resist film. Also, it is known that the accelerating voltage is set to 0.5 to 0.8 kV in use to minimize the damage to the sample due to the electron beam bombardment.

In some inspection tools, the sample is scanned with an electron beam at an accelerating voltage of 0.8 kV at a high frequency of 100 MHz to suppress charging of the sample. In other inspection tools, the DC voltage between an objective lens and a wafer sample is adjusted to suppress charging of the sample.

The electron beams used in the method of preventing charging are finely focused to diameters of several nanometers to tens of nanometers at an accelerating voltage of 0.8 kV in the same way as in ordinary scanning electron microscopy. In this case, the aperture angles (the value of the angular aperture) of the electron beams are on the order of $10^{-3}$ rad to $10^{-2}$ rad. In this way, electron beams used in normal scanning microscopes take a conic form.

Where such an electron beam is scanned over a contact hole 22 having a diameter of 0.1 μm and a depth of 1 to 1.5 μm (aspect ratio of 10 to 15) and formed in $SiO_2$ or resist 21 formed on an Si substrate 20, as shown in FIG. 2, charging occurs on the inner wall of the contact hole 22.

This is next described by referring to FIG. 3. The electron beam 1 impinging on the sample obliquely hits the side surface of the inner wall of the contact hole 22, producing a large amount of secondary electrons. This gives rise to positive charge. In particular, since the aperture angle (the value of the angular aperture) of the electron beam is as large as on the order of $10^{-3}$ to $10^{-2}$ rad, the electron beam assumes a conic form. The obliquely impinging electrons hit the side surface of the inner wall. Furthermore, the scanned beam is not strictly vertical to the sample surface, or the beam is not strictly parallel to the side surface of the inner wall of the contact hole. As a result, the trajectory of the secondary electrons se emitted from the bottom of the contact hole 22 is deflected by the electric charge on the side surface of the contact hole 22 and absorbed into the side surface. Hence, these electrons cannot escape into the opening over the contact hole 22.

A scanning electron microscope (SEM) image was obtained by the aforementioned scanning of the electron beam. The contrast of the image in the direction parallel to the contact hole is shown in FIG. 4. Variations in the signal in the direction of the cross section are shown in FIG. 5. In FIG. 4, indicated by A is the opening in the contact hole. A region B is displayed brightly because a number of secondary electrons are emitted by the edge effects. A region C is displayed darkly because the secondary electrons from the contact hole 22 are trapped in the sidewall of the contact hole. In FIG. 5, the horizontal axis indicates the scan position of the electron beam. The vertical axis indicates the intensity of the secondary electron detected.

This phenomenon gives rise to the following result. Where the aperture diameter of the contact hole 22 is greater than 0.1 μm, or where the aspect ratio is 3 to 5, a relatively narrow area of the side surface of the contact hole 22 is illuminated with obliquely incident electrons. The amount of positive charge on the side surface is smaller.

Therefore, the secondary electrons from the bottom of the contact hole 22 can escape into the upper opening. Consequently, the opening of the contact hole can be inspected with this conic electron beam. However, the detection limit is an aspect ratio of about 3 to 5 where the diameter is 0.1 μm. Furthermore, the charging of the contact hole is unstable and so the detection percentage of the opening inspection is as low as less than 80%.

The contrast-generating mechanism, where residues of $SiO_2$ or resist are present at the bottom of a contact hole, is described by referring to FIGS. 6–8. FIG. 6 shows the manner in which the contact hole is charged. Like components are indicated by like reference numerals in both FIGS. 3 and 6. The residues of $SiO_2$ or resist are indicated by 23.

Where the contact hole 22 having the residues 23 is scanned with the conic electron beam 1, the obliquely incident electrons strike the side surface of the contact hole and the residues, inducing secondary electrons. The side surface of the contact hole 22 and the residues 23 become charged positively. Because of the oblique incidence of the beam, the side surface of the contact hole produces a larger number of secondary electrons than the residues 23. In consequence, the side surface is charged to a higher positive voltage than the residues 23.

As secondary electrons emitted from the residues 23 go upward, they are accelerated upward obliquely by the positive charge on the side surface. The positive charging voltage on the sample surface close to the contact hole is lower than the voltage on the side surface because of nearly vertical incidence of the beam. The secondary electrons accelerated upward obliquely as described above are decelerated near the surface of the contact hole 22 but can escape to the secondary electron detector.

This phenomenon gives contrast to the obtained SEM image in the direction of the plane of the contact hole. This contrast is shown in FIG. 7, where A indicates the opening of the contact hole. A region B appears bright because a large number of secondary electrons are emitted by the edge effects. D indicates the bottom of the contact hole 22. Since many secondary electrons are produced from the bottom D, it appears bright. Variations in the signal intensity in the direction of the cross section of the contact hole 22 are shown in FIG. 8.

In the above-described case, the aspect ratio assumes relatively small values of about 3 to 5. Where the aspect ratio of the contact hole increases to 10 to 15, the side surface and the remaining film are charged positively in the same way as the foregoing. However, the side surface is charged to a higher positive voltage than where the aspect ratio takes small values of 3 to 5 because a larger amount of the electron beam obliquely impinges on the side surface of the contact hole, producing a larger number of secondary electrons.

Accordingly, secondary electrons produced by the remaining film are accelerated obliquely upwardly by the positive electric charge on the side surface as they go upward. The trajectory is deflected by the higher positive charge voltage on the side surface. Consequently, the secondary electrons collide against the side surface of the contact hole.

The result is that the secondary electrons emanating from the remaining film is unable to escape to the surface of the contact hole. The contrast in the direction of the plane of the contact hole is different from the contrast shown in FIG. 7. Rather, the inside of the bright annular portion that is made bright by the edge effects is darker as shown in FIG. 4, because the secondary electrons cannot escape from the opening of the contact hole. If the remaining film is exorbitantly thick and thus the effective aspect ratio is as small as about 3 to 5, the condition will be the same as the condition shown in FIGS. 7 and 8. However, if the remaining film is less than tens of nanometers (i.e., the aspect ratio is 10 to 15), the inside becomes darker. This demonstrates that increasing the aspect ratio of the contact hole makes it more difficult to obtain secondary electron contrast corresponding to the thickness of the remaining film.

SUMMARY OF THE INVENTION

In view of the foregoing, the present invention has been made.

It is an object of the present invention to provide a defect-review SEM for inspecting defective openings in small holes (e.g., having diameters of less than 0.05 $\mu$m and having high aspect ratios of 10 to 15, for example) with high throughput.

It is another object of the present invention to provide a method of inspecting contact holes as described above by a defect-review SEM with high throughput.

A defect-review SEM, in accordance with the present invention, comprises an electron gun for producing an electron beam, an objective lens for focusing the electron beam onto a sample such that the beam hits the sample at a convergence angle to thereby produce secondary electrons or backscattered electrons, upper- and lower-stages of deflectors for scanning the electron beam across the sample in two dimensions, an angular aperture control lens for controlling the convergence angle, i.e., the angular aperture of the electron beam, and a detector for detecting the secondary electrons or backscattered electrons. The electron beam is scanned while vertical incidence on the sample is maintained by the upper- and lower-stages of deflectors.

The convergence angle of the electron beam impinging on the sample is minimized by the angular aperture control lens. The beam scans the sample while kept vertical to the sample by the upper- and lower-stages of deflectors.

The secondary electrons or backscattered electrons emanating from the sample are detected by the detector.

In one embodiment of the invention, the convergence angle of the electron beam hitting the sample is set to $10^{-5}$ to $10^{-6}$ rad. The angular aperture control lens can control the convergence angle of the beam hitting the sample from a large angle to a small angle. In the observation mode, the convergence angle is switched to a large value. In the inspection mode, the convergence angle is switched to a small value.

The defect-review SEM is further equipped with a doughnut-like detector for detecting the secondary electrons or backscattered electrons induced by the bombardment of the electron beam. This detector is located behind the objective lens on the optical axis of the electron beam.

In another feature of the invention, an electric field control lens is mounted between the sample and the objective lens. The voltage applied between the sample and the field control lens can be adjusted within a range from 0 to ±1 kV.

In a method of inspecting numerous contact holes in a sample in accordance with the present invention, the sample is illuminated with an electron beam at a convergence angle of $10^{-5}$ to $10^{-6}$ rad. The beam is scanned in two dimensions while kept vertical to the sample. Resulting secondary electrons or backscattered electrons are detected by a doughnut-like detector mounted on the optical axis of the electron beam behind the objective lens.

A reference sample is used in the defect-review SEM, in accordance with the present invention, to adjust the convergence angle of the electron beam and the vertical incidence. The reference sample has a groove or hole having an inner vertical wall. The reference sample has scales located at different heights.

The groove having the inner vertical wall is formed by mounting two members having vertical side surfaces via a gap between them such that their vertical side surfaces face each other. Alternatively, grooves having inner vertical walls and extending in different directions may be formed.

In a further embodiment of the invention, the reference sample comprises four rectangular parallelepipeds having vertical side surfaces and scales located at different heights. The four rectangular parallelepipeds are arranged in two rows and two columns via given spaces between them in a two-dimensional manner. Using this reference sample, the convergence angle and vertical incidence of the electron beam are adjusted.

In addition, the four rectangular parallelepipeds having the vertical side surfaces are cut from a (100) single crystal of Si or GaAs. The scales consist of pieces of mesh of Ni or gratings. Each cut parallelepiped has a thickness of about 0.6 to 0.7 mm and is about 10 mm square on the plane. The space between the four parallelepipeds is 0.1 to 0.2 mm. The pieces of mesh are of to 100 $\mu$m mesh. One of the heights at which the scales are located is flush with the height of the top surfaces of the parallelepipeds, while the other height is flush with the height of the bottom surfaces of the parallelepipeds.

Other objects and features of the invention will appear in the course of the description thereof, which follows.

DETAILED DESCRIPTION OF THE INVENTION

Figure 9:
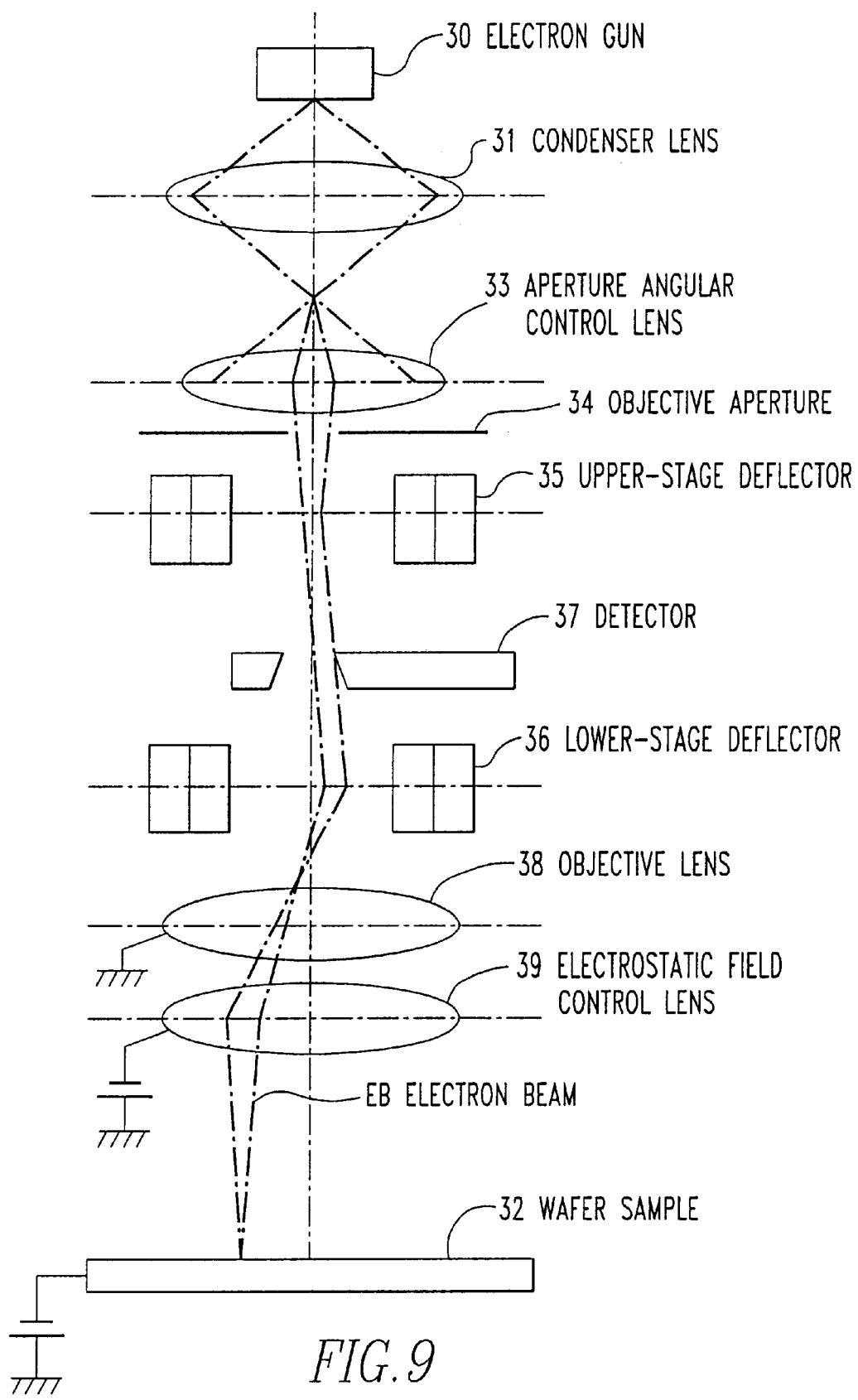
FIG. 9 is a diagram illustrating the electron optics of a defect-review SEM in accordance with the present invention.

The preferred embodiments of the present invention are hereinafter described by referring to the accompanying drawings. FIG. 9 shows a defect-review SEM (scanning electron microscope) in accordance with the present invention. This instrument has an electron gun 30 capable of producing a collimated electron beam of high intensity (e.g., $10^7$ A/cm$^2$·steradian) like various field emission guns.

This electron gun 30 can be switched between various accelerating voltages. Since the apparatus is intended to inspect defects of contact holes in resist on a patterned wafer or an oxide film of $SiO_2$, for example, or defects in patterns of metallization, such as Al or Cu, the electron beam is decelerated by a decelerating voltage (described later) applied to the sample to minimize static charge on the wafer due to the electron beam. The accelerating voltage finally applied to the sample is principally in the range from 0.4 to 1 kV. The electron gun 30 is equipped with a control circuit (not shown) for controlling the accelerating voltage, the extraction voltage, and other factors.

The electron beam generated by the electron gun 30 and accelerated is focused by a condenser lens 31. This condenser lens 31 may be either of the electric field type or the magnetic field type. The condenser lens 31 can adjust the probe current of the electron beam EB impinging on a wafer sample 32 within a range from about $10^{-12}$ to $10^{-8}$ A.

An angular aperture control lens 33 may be either an electric field lens or a magnetic field lens and acts to control the convergence angle, i.e., the angular aperture and the diameter of the electron beam EB hitting the sample 32. An objective aperture 34 is provided with aperture holes. Any one of them is selected in use. The shape of the aperture holes can be circular, rectilinear, square, rectangular, or other form. The aperture 34 can be mounted within the angular aperture control lens 33, as well as in the illustrated position.

Circular aperture holes are selected when circular contact holes or the morphologies of microscopic foreign matter are observed. Rectilinear, square, and rectangular apertures are employed when metallization patterns are inspected for defects by voltage contrast microscopy. That is, if one or more layers of metallization break at a location, the incident electron beam induces charging at this location. Where the apertures are rectilinear, square, or rectangular, the direction in which the electron beam is scanned is made coincident with the metallization pattern by a scan rotation function.

An upper-stage X-Y deflector 35 and a lower-stage X-Y deflector 36 have an X-Y aligning function. These deflectors 35 and 36 scan the electron beam EB across the wafer sample 32 in two dimensions, i.e., within the X-Y plane.

The aligning function of the upper-stage deflector 35 assures that the electron beam impinges on the wafer sample 32 vertically at each scan position during the two-dimensional scan of the electron beam. The aligning function of the lower-stage deflector 36 aligns the electron beam EB.

These deflectors 35 and 36 are of the electrostatic type and can switch the scanning mode between line scanning mode (one-dimensional scanning) in which scanning is made in increments of up to hundreds of micrometers on the wafer sample 32 and X-Y plane scanning (two-dimensional scanning) in which scanning is made in increments of hundreds of micrometers. The scan rate of the electron beam can be switched from 4096 pixels per line to 512 pixels per line.

Where one line is composed of 4096 pixels, the scan rate can be changed from slow scan (20 msec/4096=4.88 $\mu$sec/pixel) to TV scan (63.5 $\mu$sec/4096=15.5 nsec/pixel). Where one line is composed of 512 pixels, the scan rate can be changed from TV scan (63.5 $\mu$sec/512=124 nsec/pixel) to 100 MHz (5.12 $\mu$sec/512=10 nsec/pixel). Accordingly, in TV scanning, the scan rate can be varied from 4096 pixels per line providing fine texture to 512 pixels per line providing rough texture. Therefore, in TV scanning, where the electron beam scans the sample in equal increments, the texture can be varied over a range of eight times. Furthermore, in TV scanning, if one line is examined with 512 pixels and then it is attempted to reexamine a field of view of interest and its vicinities to the same degree of texture, a field of view 8×8=64 times as wide as the field of view of interest can be inspected in the same scanning time.

Figure 1:
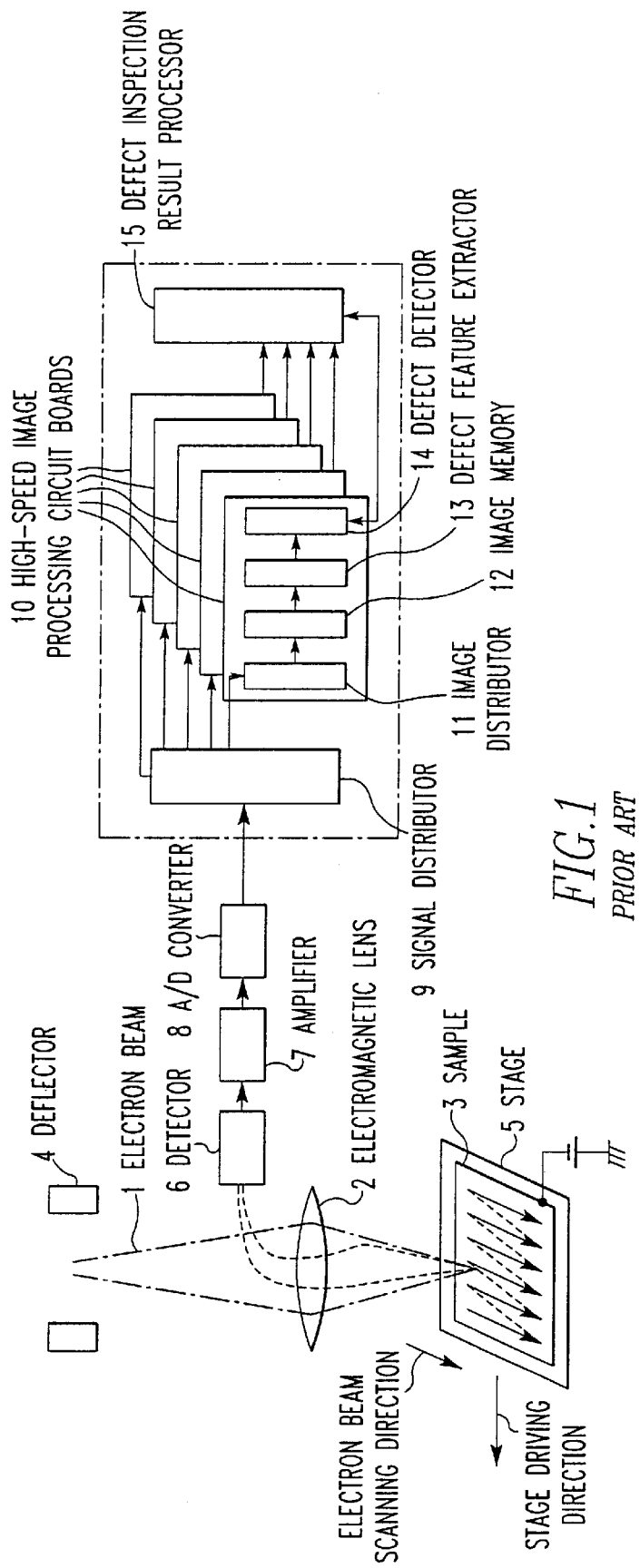
FIG. 1 is a schematic diagram of the prior art defect-review SEM for inspecting apertures of contact holes.
Figure 2:
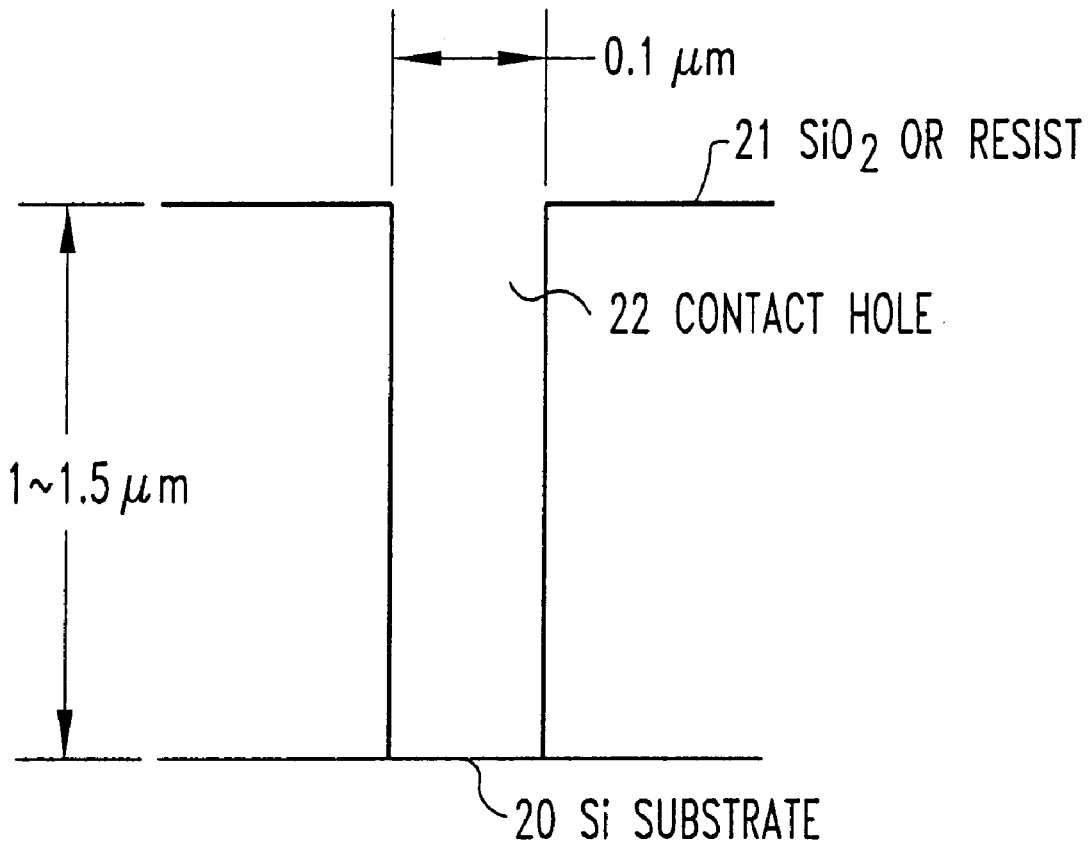
FIG. 2 is a diagram illustrating a contact hole.

A detector 37 is located between the upper-stage deflector 35 and the lower-stage deflector 36. This detector is shaped like a doughnut, provided with a minute opening having an optical axis that permits passage of the electron beam. This detector 37 can be a high-speed semiconductor detector, such as a Schottky barrier diode, PIN diode, or avalanche photodiode or a combination of YAP crystal, plastic scintillator, compound semiconductor scintillator or the like, and a photomultiplier adapted for wavelengths emitted by the high-speed semiconductor detector. The output signal from the detector 37 is fed to a high-speed image processing unit (8–15) (not shown in FIG. 9) comprising the amplifier 7 and the following stages of components shown in FIG. 1, the unit acting to detect defects.

An objective lens 38 of the magnetic field type focuses the electron beam EB onto the wafer sample 32. An electrostatic field control lens 39 can vary the voltage within the range from 0 to ±1 kV relative to the wafer sample 32. Therefore, voltages applied to the electric field control lens 39 and the sample 32, respectively, can be adjusted independently. For example, a voltage of −10 kV to −11 kV is applied to the electric field control lens 39. The sample 32 is placed on a stage (not shown) electrically isolated from the sample. For instance, a voltage of −9 kV to −11 kV is impressed on the sample 32. These decelerating voltages decelerate the electron beam EB down to a desired accelerating voltage of 1 to 0.4 kV before the beam reaches the sample 32 provided that the electron beam not yet decelerated has an energy of 10 to 12 keV. The operation of the structure of the instrument constructed in this way is now described.

In the structure described above, the probe current of the electron beam EB impinging on the wafer sample 32 can be varied by a condenser lens 31. The angular aperture control lens 33, the objective lens 38, and the objective aperture 34 are controlled in step with this probe current by a microprocessor (not shown) or the like.

In particular, the defect-review SEM of the construction shown in FIG. 9 can be switched between an inspection mode and an observation mode. The inspection mode is selected where contact holes are inspected, metallization patterns are inspected for defects, or devices are inspected for microscopic foreign matter. The observation mode is selected where the morphologies of defects are observed. At this time, the electron beam incident on the wafer sample 32 assumes a conic form having a large convergence angle of $10^{-2}$ to $10^{-3}$ rad in the same way as in ordinary scanning electron microscopy.

Where the inspection mode is selected to inspect contact holes or inspect metallization patterns for defects, the angular aperture control lens 33 is controlled in synchronism with the objective lens 38 so that the electron beam EB hitting the wafer sample 32 assumes a small convergence angle, e.g., $10^{-5}$ to $10^{-6}$ rad. As a result, the beam is substantially collimated. Where the observation mode is selected, the angular aperture control lens 33 is controlled in synchronism with the objective lens 38 to control the convergence angle of the electron beam EB falling on the wafer sample 32 to a relatively large angle, $10^{-2}$ to $10^{-3}$ rad. In consequence, the beam assumes a conic form.

The electron beam EB whose convergence angle is controlled by the lenses is scanned in two stages across the sample 32 about the vicinity of the back focal point of the objective lens 38 by the upper-stage deflector 35 and the lower-stage deflector 36. The beam also scans the surface of the wafer sample 32 vertically.

Where the objective lens 38 is a magnetic field lens, the image rotates where the mode of operation is switched from the inspection mode to the observation mode or vice versa. Therefore, rotation-compensating currents are fed to the upper-stage deflector 35 and to the lower-stage deflector 36 in synchronism with the scanning current.

Where the aforementioned inspection mode is selected, the scan rate of the electron beam is from TV scan rate to 10 MHz. Where the observation mode is selected, the scan rate is switched from slow scan to TV scan.

The wafer sample 32 is placed on the X-Y stage (not shown), which is moved continuously or by the step-and-repeat scheme. In the latter case, the stage is moved into a desired position on the sample and stopped there. The electron beam is scanned in two dimensions and observations are made. On completion of the observations, the stage is moved into a next desired position and stopped there. Then, observations are performed. These operations are subsequently repeated. To perform inspections, including inspections of contact holes for defective apertures, inspections of metallization patterns for defects, and inspections for microdefects, with high throughput, the electron beam is scanned along a line (one-dimensional scan) in increments of 100 μm at maximum. The sample 32 is moved continuously by the stage, and automated inspection is carried out. Usually, this automated inspection is performed in the inspection mode.

Where a defect is observed in the observation mode, it is necessary to inspect its vicinities. At this time, the mode of operation is switched from the observation mode to the inspection mode. The sample 32 is not moved continuously by the stage. Rather, the sample is kept driven by the step-and-repeat scheme. To perform enlarged inspection of the vicinity of the defect, the electron beam EB is scanned in two dimensions in the X-Y plane within a region hundreds of micrometers square, 4096 pixels per side. Thus, the device is inspected meticulously for defects.

Where the equipment is operated in the inspection mode by the TV scan with 512 pixels per side, for example, if a defect is found, the mode of operation may be switched to the TV scan with 4096 pixels per side, and an area 64 times as wide as the former area is inspected with the same area pixel density.

To inspect contact holes or metallization patterns efficiently, information about the position of a region that is regarded as producing problems from semiconductor design considerations is created based on CAD design data. For example, the electron beam is aimed at an anxious contact hole, or the wafer sample is moved into only an area having a possible defective metallization pattern. The stage is driven by the step-and-repeat scheme. The electron beam EB is moved in two dimensions across this region in the inspection mode.

As the wafer sample 32 is illuminated with the electron beam EB, secondary electrons are produced. These electrons are accelerated by the voltage, e.g., 11 kV, between the sample 32 and the electric field control lens 39 and by the voltage between the lenses 39 and 38 and made to enter the detector 37.

If the voltage applied to the electric field control lens 39 is set lower than the sample, only lower-energy components of the secondary electrons emanating from the sample can be removed. Thus, lower-energy secondary electrons which are affected by the electric charge on the sample are cut off. Hence, more reliable data can be derived. Normally, backscattered electrons are detected by the detector 37, as well as secondary electrons. The portion of the backscattered electrons of the detected electrons relatively increases by cutting lower-energy secondary electrons. As the energy of electrons detected increases, the effect of electric charge on the sample becomes less conspicuous. Therefore, a scanned image created from this signal is less affected by the electric charge on the sample and provides more reliable data.

The detector 37 is installed between the upper-stage deflector 35 and the lower-stage deflector 36 in FIG. 9. The detector may also be positioned between the upper-stage deflector 35 and the objective aperture 34 or between the lower-stage deflector 36 and the objective lens 38. The position of the detector can be determined by taking account of their advantages. However, since the time it takes for the secondary electrons emitted from the sample 32 to reach the detector is roughly in proportion to the distance from the sample to the detector, it is desired to mount the detector between the lower-stage deflector 36 and the objective lens 38 so as to minimize the distance to the sample, for the following two major reasons.

First, the flight time of the secondary electrons reaching the detector can be shortened. Where the electron beam EB is scanned at a high rate corresponding to 10 nsec per pixel by the lower-stage deflector 36, the flight time of the secondary electrons is less than 10 nsec, preferably on the order of nanoseconds.

Secondly, the detector 37 can be installed in the back focal position of the objective lens 38. This position can be the center of deflection of the electron beam. Therefore, the area of the aperture in the center of the detector can be made smaller than where the detector is installed in other positions. Where the beam is scanned in the X-Y plane, the aperture of the detector can be square. Where a defect inspection is done using SWATH images, the electron beam is scanned along only the X- or Y-axis and so the aperture of the detector may assume a rectangular form close to a line. Consequently, of the secondary electrons emitted from the sample 32, those having a wide range of angles to the optical axis of the electron beam can be detected.

Figure 10:
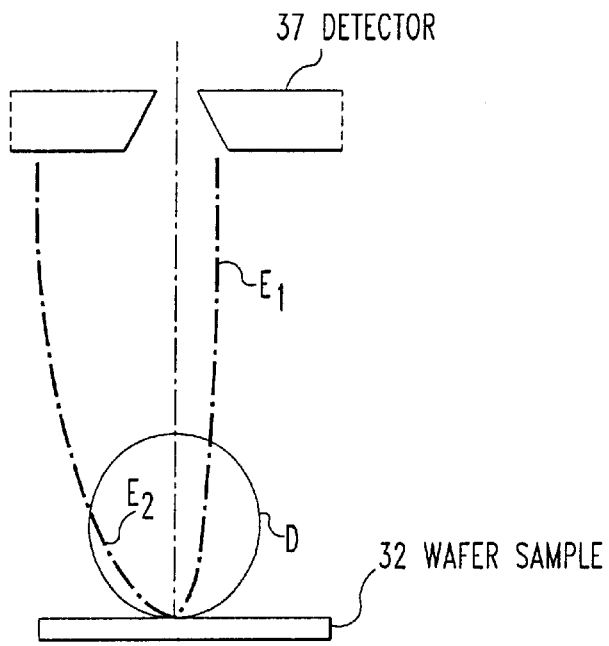
FIG. 10 is a diagram illustrating a manner in which secondary electrons are produced at a large angle and at a small angle from a sample.

FIG. 10 illustrates the manner in which secondary electrons are released from the wafer sample 32. The distribution of the angles of the secondary electrons released from the sample 32 is indicated by D, i.e., the emission intensity distribution relative to the emission angle. The trajectory of the secondary electrons released at a small angle is indicated by $E_1$. The trajectory of the secondary electrons released at a large angle is denoted by $E_2$.

Figure 11:
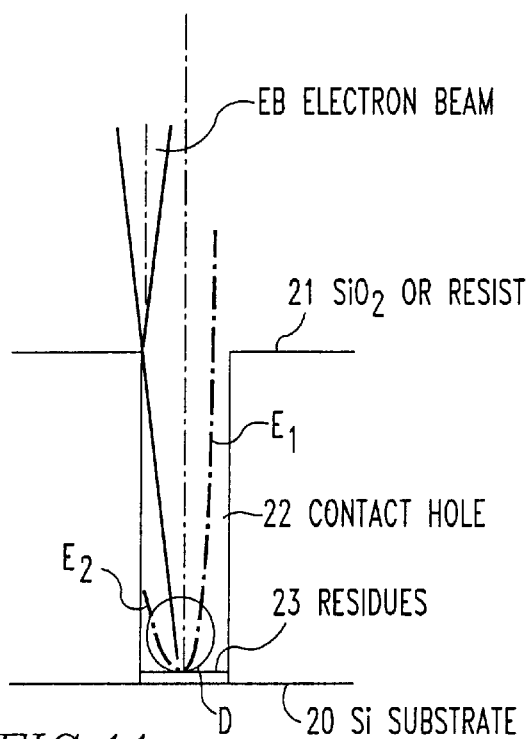
FIG. 11 is a diagram illustrating a manner in which secondary electrons are produced at a large angle and at a small angle from the bottom of a contact hole having a high aspect ratio.

Secondary electrons from the bottom of a contact hole are now discussed. Referring to FIG. 11, a contact hole 22 has an aperture diameter of 0.1 $\mu$m and an aspect ratio of 10 to 15. The secondary electrons $E_2$ released at a large angle collide against the side surfaces of the contact hole and disappear. Accordingly, in order to detect as many secondary electrons $E_1$ released at a small angle as possible, it is essential to minimize the diameter of the aperture in the detector 37 through which the electron beam passes. As a result, positioning the detector 37 near the back focal position of the objective lens 38 gives optimum results.

The electron beam impinging on the wafer sample 32 is discussed again. It is assumed that one objective aperture diameter (e.g., 50 $\mu$m) is selected in both inspection mode and observation mode. The angular aperture control lens 33 and the objective lens 38 are controlled in an interlocking manner. The convergence angle of the electron beam EB hitting the sample 32 is controlled to the order of $10^{-2}$ to $10^{-6}$ rad. The diameter of the beam is controlled within a range from 5 to 50 nm.

To obtain good contrast from film residues 23 where the contact hole 22 has an aperture diameter of 0.1 $\mu$m and an aspect ratio of 10 to 15 (0.1 $\mu$m/2×1.0 to 1.5 $\mu$m=0.05 to 0.03 rad) as shown in FIG. 11, the convergence angle of the electron beam in a normal scanning electron microscope must be $1/10$ to $1/100$ of 0.05 to 0.03 rad, i.e., $3 \times 10^{-5}$ to $10^{-6}$ rad, for the following reason.

Figure 6:
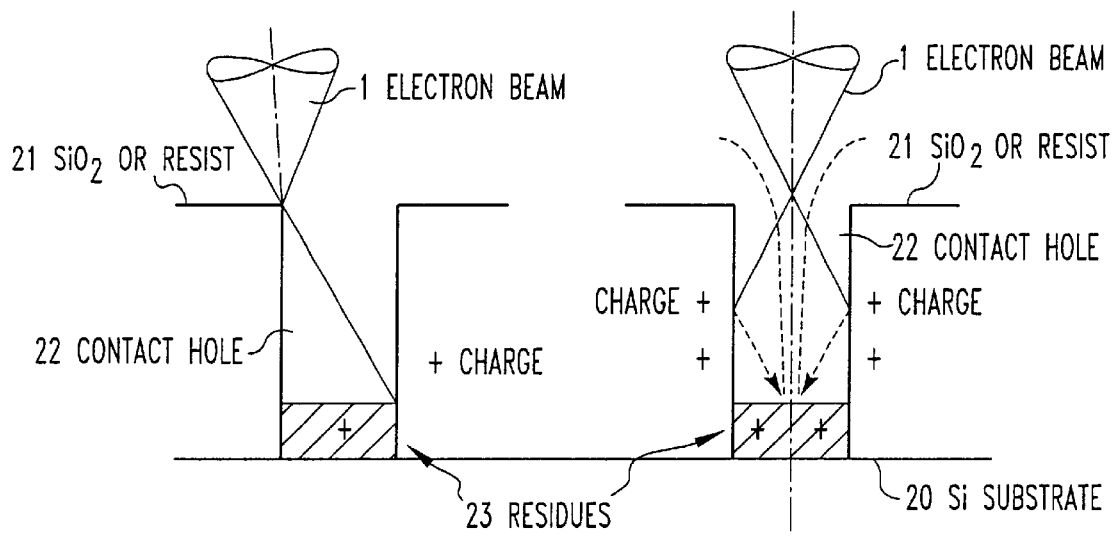
FIG. 6 is a diagram illustrating the mechanism by which a contact hole produces contrast where a film is left at the bottom of the contact hole.

As already described in connection with FIG. 6, the electron beam in a normal scanning electron microscope assumes a conic form on the order of $10^{-3}$ rad. Just when the beam touches the end of the contact hole, obliquely incident electrons collide against the side surface of the contact hole and charge it positively. To avoid this, the convergence angle must be sufficiently small, $10^{-5}$ to $10^{-6}$ rad. Furthermore, the electron beam must be incident parallel to the side surface of the contact hole, i.e., vertical to the surface of the wafer sample 32.

Figure 3:
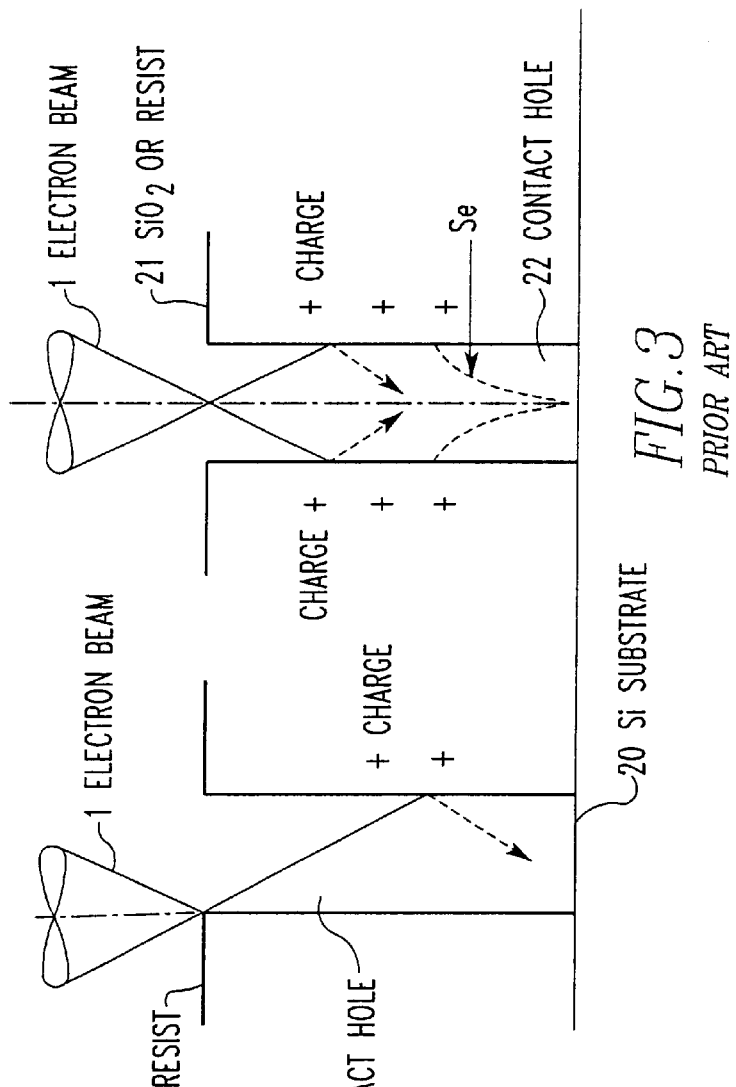
FIG. 3 is a diagram illustrating charging on the inner side surface of a contact hole.
Figure 4:
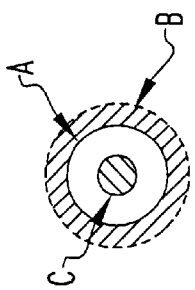
FIG. 4 is a diagram illustrating contrast in the direction of the plane of a contact hole.
Figure 5:
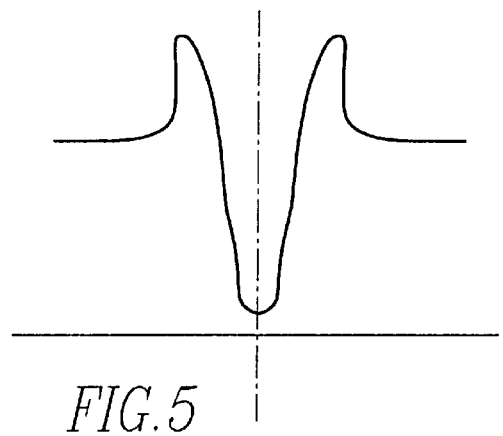
FIG. 5 is a graph showing variations in signal intensity in the direction of the plane of the contact hole shown in FIG. 4.
Figure 7:
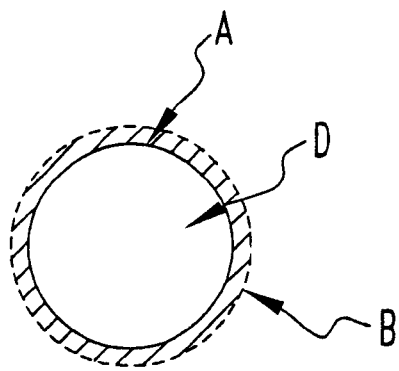
FIG. 7 is a view illustrating contrast in the direction of the plane of a contact hole.
Figure 8:
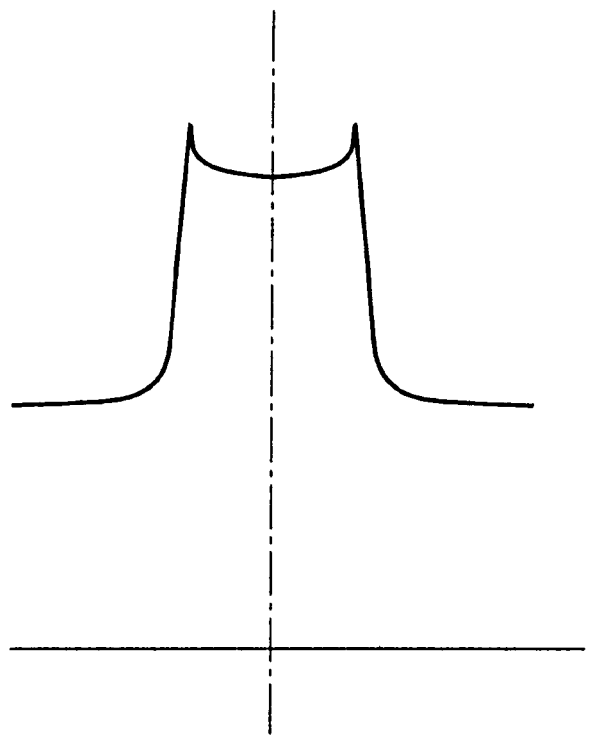
FIG. 8 is a graph showing variations in signal intensity in the direction of the cross section of the contact hole shown in FIG. 7.
Figure 12:
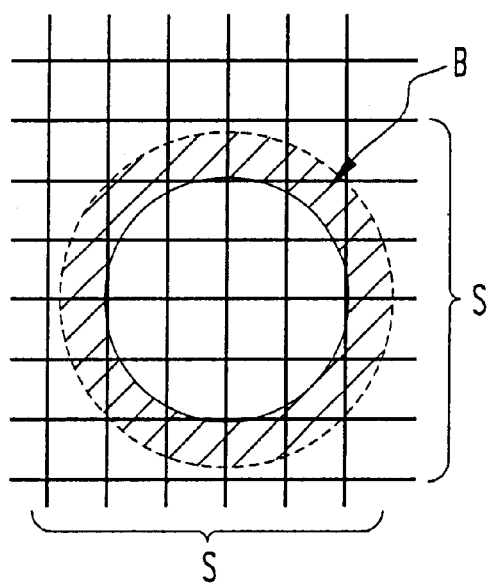
FIG. 12 is a diagram illustrating the relation between a contrast image of a contact hole and the number of pixels in the prior art method.

To cause the electron beam to be incident vertical to the wafer sample 32, the electron beam is scanned by the upper-stage deflector 35 and the lower-stage deflector 36. At the same time, to achieve accurate vertical incidence, adjustments using the aligning functions of the deflectors are necessary while observing the contact hole with a secondary electron image. The adjustments need to be made using the aligning functions in such a manner that annular bright contrast due to the edge effects shown in FIG. 7 exhibits rotation symmetry.

Where the opening of the contact hole is observed with a conic electron beam (having a beam diameter of 5 to 8 nm, a convergence angle on the order of $10^{-3}$ rad, and a beam current of 50 to 200 pA) used in the prior art scanning electron microscope, the edge effects are emphasized (see FIG. 3). Therefore, where adjacent contact holes are compared in terms of pattern, about 12×12 to 7×7 pixels need to be detected as shown in FIG. 12, where B indicates a brightly displayed portion due to the edge effects of the contact hole. Each one lattice shown indicates a pixel. A range of necessary pixels is indicated by S.

Figure 13:
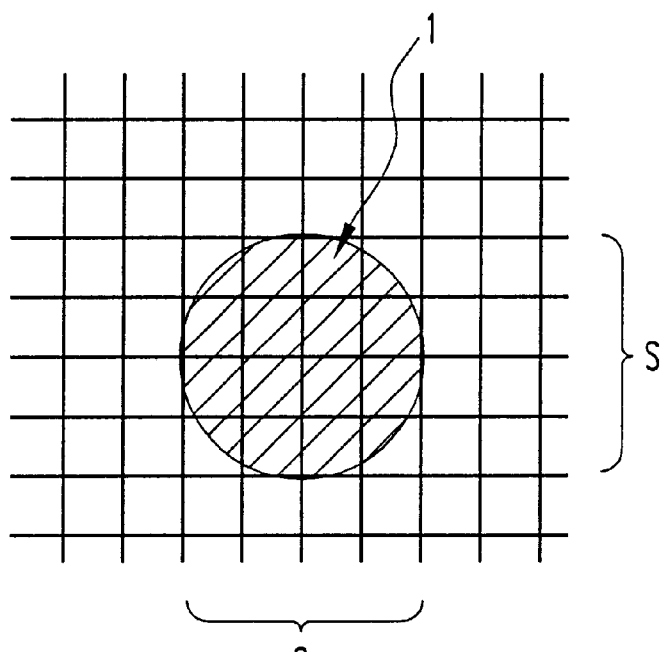
FIG. 13 is a diagram illustrating the relation between a contrast image of a contact hole and the number of pixels in a defect review method in accordance with the present invention.

On the other hand, in the present invention, the electron beam directed to the sample is well collimated. That is, the convergence angle of the electron beam is $10^{-5}$ to $10^{-6}$ rad. The diameter of the beam is 25 to 100·nm. The beam current is 50 pA to 5 nA. Contact holes are inspected with this beam. Therefore, as shown in FIG. 13, the edge effects are suppressed. The contrast inside I of the contact hole is made substantially uniform. Owing to these effects, the range S of the detected pixels can be suppressed to less than 5×5 pixels.

Consequently, the number of detected pixels can be halved compared with the prior art technique. Hence, the calculation time used for comparison of patterns for defect inspection can be halved. Inspections can be performed with higher throughput. Similar advantages can be obtained where voltage contrast of defective metallization patterns is observed.

A voltage of −9 to −11 kV is applied to the sample 32. A voltage of −10 to −11 kV is applied to the electric field control lens 39 that is of the electrostatic type and located in front of the sample 32. The voltage between the electric field control lens 39 and the wafer sample 32 can be varied within a range from 0 to ±1 kV as mentioned previously. One of the roles of this electric field control lens is to control the voltage applied to the electric field control lens 39 so as to suppress charging of the whole wafer sample and the opening in the contact hole provided that the opening in the contact hole is electrically charged when a patterned wafer sample is being observed with the electron beam EB, thus deteriorating the contrast of the contact hole. The result is that the opening of the contact gives good contrast.

It is assumed that the control voltage to the electric field control lens is established elaborately in a long time while taking note of only charging and contrast of only a small part on the wafer sample, e.g., the opening in a contact hole within one chip. Subsequently, if the contact holes in other chips within the same wafer sample are inspected, there is a possibility that they are electrically charged. That is, the elaborate establishing operation on a part subtly changes the charging condition. Therefore, instead of taking note of only one location on the wafer sample, it is necessary to establish the control voltage while observing the center of the wafer and the chips at the four corners.

A method of verifying the convergence angle of the electron beam and the vertical scan of this instrument, an adjustment method for the instrument, and a method of examining the diameter of the electron beam are described in detail below. An appropriate reference sample is prepared and used for these purposes.

The convergence angle of the electron beam and the vertical scanning are adjusted by combining a method of adjusting parallel scanning of the electron beam with a method of adjusting the degree of verticalness of the electron beam as described later. If necessary, this process is repeated two or three times.

The convergence angle of the electron beam is checked by making use of the adjustment of the degree of verticalness of the electron beam described above. The vertical scanning of the electron beam is confirmed by utilizing both adjustment of the parallel scanning of the electron beam and adjustment of the degree of verticalness of the beam. The diameter of the beam must be checked after completion of the adjustments of the convergence angle of the beam and the vertical scanning.

Figure 14:
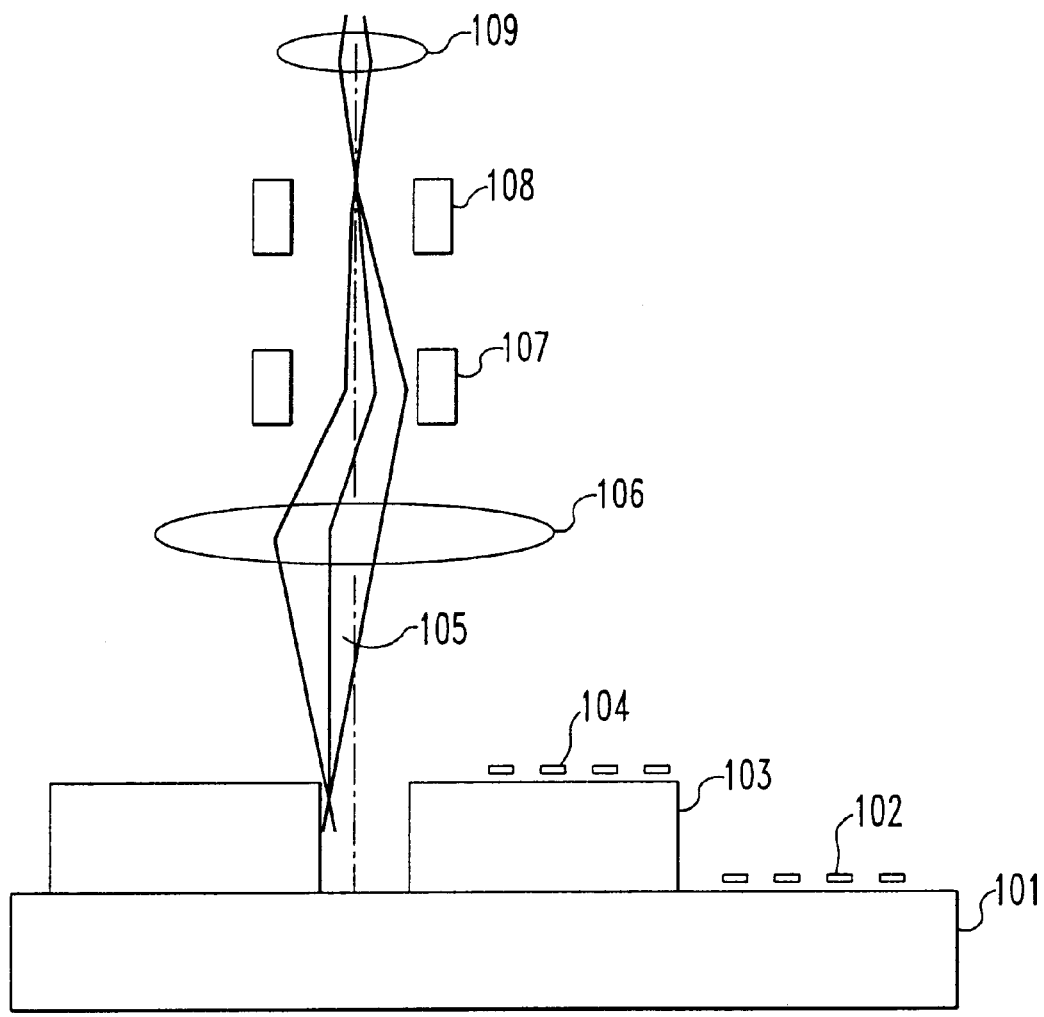
FIG. 14 is a diagram illustrating the relation between the electron beam optics of a defect-review SEM in accordance with the present invention and a reference sample used for verification and adjustment of the defect-review SEM.
Figure 15:
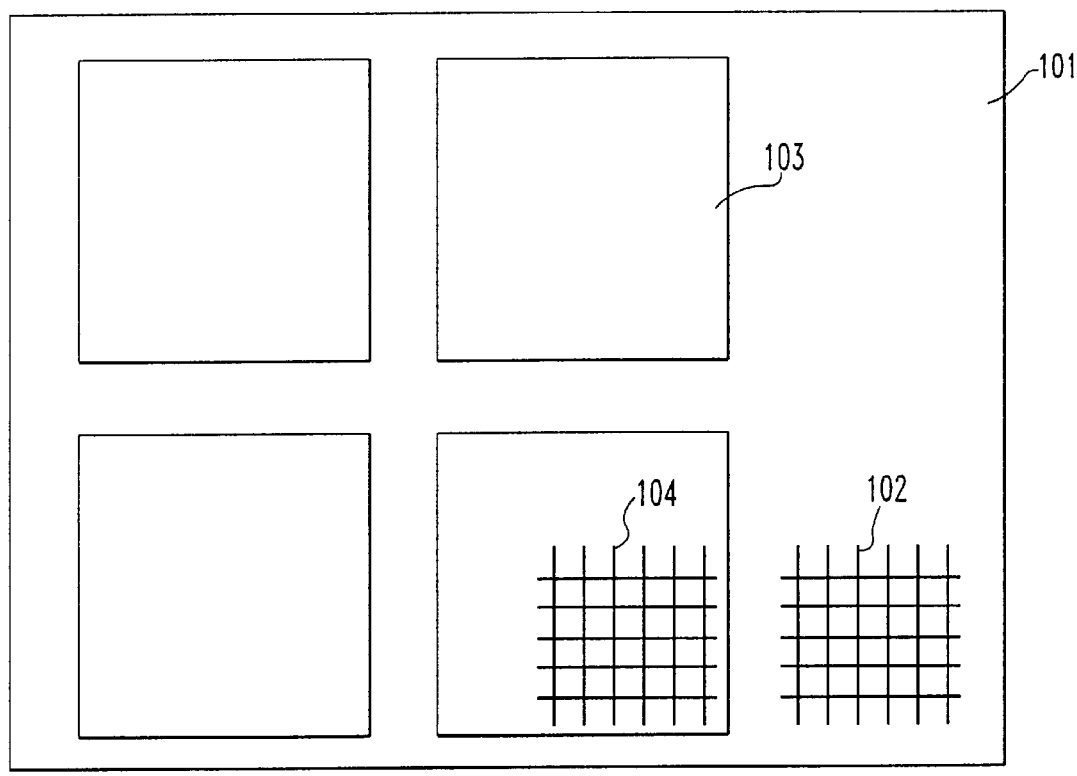
FIG. 15 is a plan view of the reference sample shown in FIG. 14.
Figure 16:
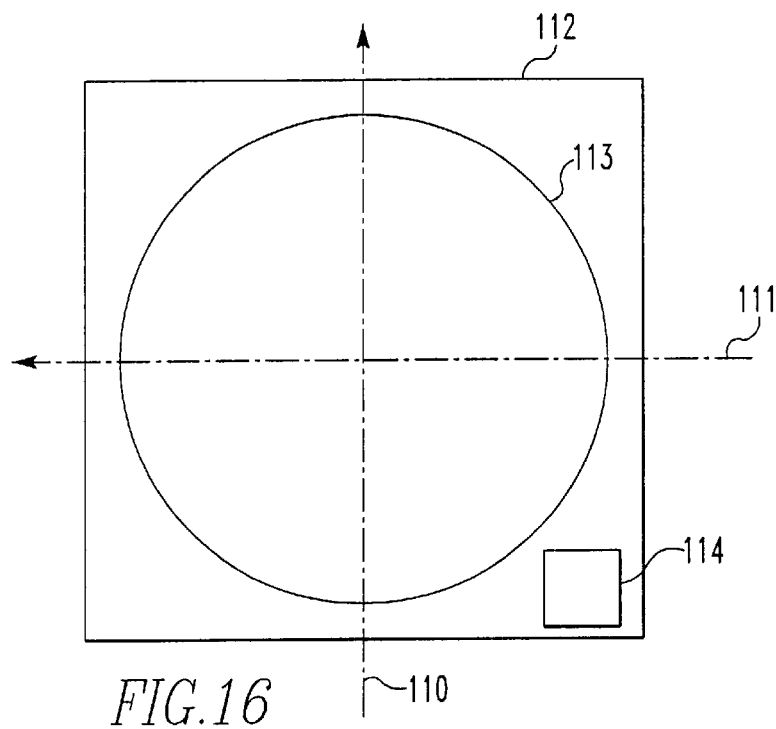
FIG. 16 is a plan view showing the direction of motion of a sample stage when it is driven within the X-Y plane and the arrangement of a wafer sample and a reference sample, illustrating the verification and adjustment of the defect-review SEM in accordance with the present invention.

FIG. 14 is a diagram illustrating the relation between the electron optics of a defect-review SEM in accordance with the present invention and a reference sample. FIG. 14 is similar to FIG. 9 except that a cross section of the reference sample is added. FIG. 15 is a plan view of the reference sample. FIG. 16 is a plan view illustrating a method of driving a sample stage within the X-Y plane and the arrangement of a wafer sample and a reference sample.

Referring to FIG. 14, the reference sample is carried on a base plate or substrate 101. A scale 102 is used to calibrate the increments of scan motion of the electron beam. For example, the scale is of 100 to 25 $\mu$m mesh and made of Ni, made of a grating, or the like. This scale 102 is stuck in a two-dimensional manner on the substrate 101. A rectangular parallelepiped 103 is obtained by cutting a (100) single crystal of Si having a thickness of about 0.7 mm or a (100) single crystal of GaAs having a thickness of 0.6 mm into about 10 mm square. The cut surfaces are parallel to the crystal plane. The adjacent cut surfaces of the rectangular parallelepiped 103 are almost rectangular to each other. If these requirements are satisfied, any other shape can be used. The rectangular parallelepiped 103 is stuck on the substrate 101 in such a way that one of the widest planes of the rectangular parallelepiped 103 is in contact with the top surface of the substrate 101. Other scales 104 similar to the scale 102 are arranged in a plane and stuck on the rectangular parallelepiped 103.

Also shown in FIG. 14 are an electron beam 105, an objective lens 106, a lower-stage deflector 107, an upper-stage deflector 108, and an angular aperture control lens 109 which are extracted from FIG. 9 and used to describe the verification and adjustment. FIG. 9 shows the electron optics of a defect-review SEM in accordance with the present invention.

The electron beam 105 is deflected by the upper-stage deflector 108 and the lower-stage deflector 107 and reaches the objective lens 106. The beam is then made to hit the top surface of the rectangular parallelepiped 103 while the given convergence angle and the given incident angle of the beam are maintained by the objective lens 106. The convergence angle and the diameter of the beam are controlled by the angular aperture control lens 109. The incident angle of the beam is controlled by the upper-stage deflector 108 and the lower-stage deflector 107. A detector (not shown) for detecting secondary electrons or backscattered electrons is located between the upper-stage deflector 108 and the objective lens 106.

FIG. 15 is a plan view of reference samples. Four rectangular parallelepipeds 103 and a scale 102 are stuck on a substrate 101. Another scale 104 is stuck on one of the rectangular parallelepipeds 103. The four rectangular parallelepipeds 103 are so arranged that their cut surfaces are parallel to each other and that the parallelepipeds are spaced 0.1 to 0.2 mm from each other. The direction of the scales 102 and 104 (e.g., the direction of the lines of the mesh) are parallel or vertical to the directions of the side surfaces of the rectangular parallelepipeds 103.

FIG. 16 is a plan view showing the direction in which a sample stage is driven within the X-Y plane. Furthermore, the arrangement of a wafer sample and a reference sample is shown. The direction in which the sample stage is driven along the Y-axis is indicated by 110. The direction in which the sample stage is driven along the X-axis is indicated by 111. Z-axis and other drive axes are omitted. A stage top 112 holding the sample is driven along the X- or Y-axis. A wafer sample 113 is detachably mounted to the stage top 112. A reference sample 114 has the scale 102, etc. stuck on the substrate 101 shown in FIG. 15. The reference sample 114 is mounted to the stage top 112 fixedly or detachably.

At this time, the height of the rectangular parallelepiped 103 of the reference sample 114 is substantially coincident with the height of the wafer sample 113. One of the cut surfaces of the rectangular parallelepiped 103 of the reference sample 114 is almost coincident with the direction in which the sample stage is driven along the X-axis, while the other cut surface substantially agrees with the direction in which the sample stage is driven along the Y-axis.

Figure 17:
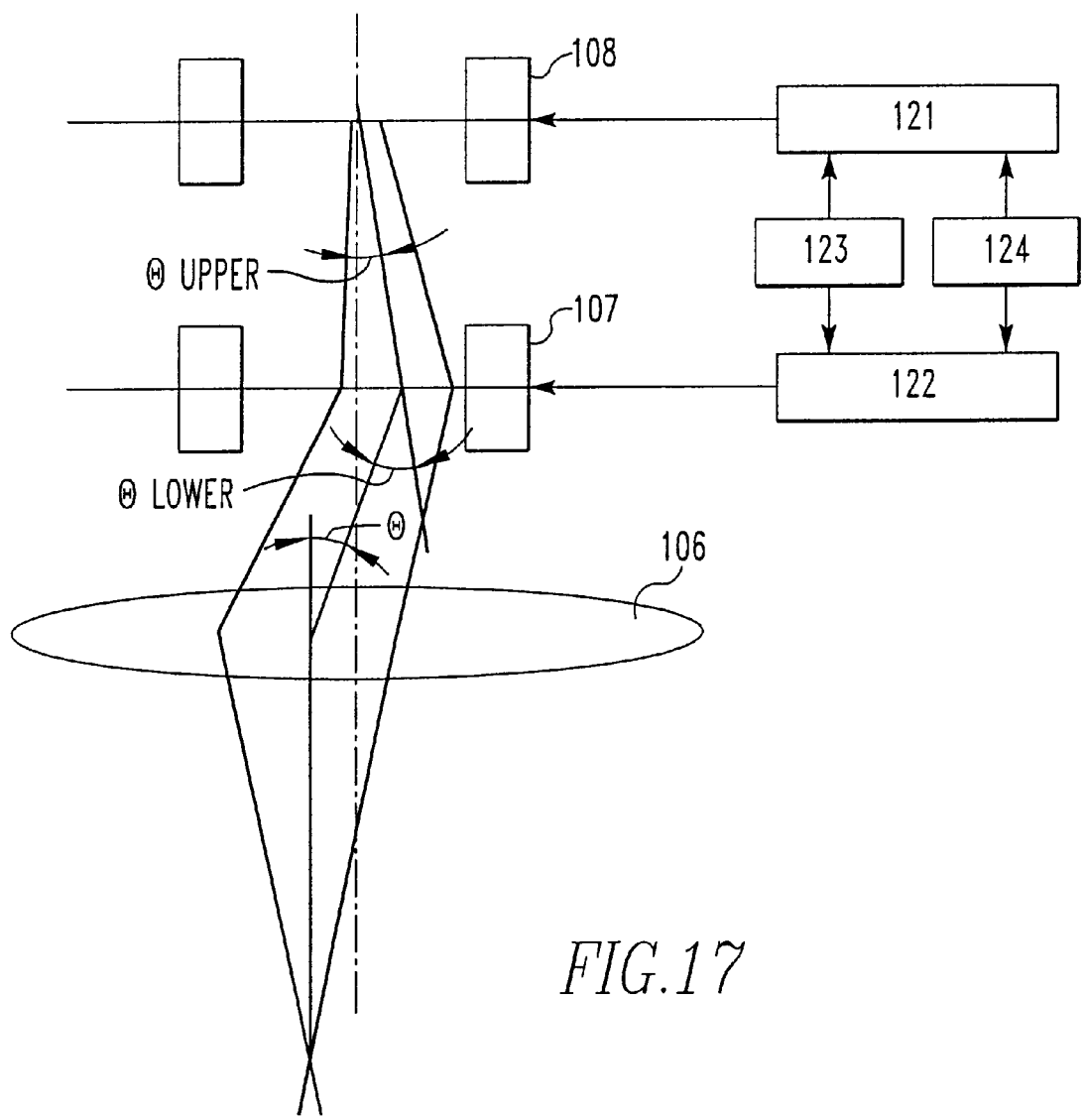
FIG. 17 is a diagram illustrating the verification and adjustment of a vertical scan of the electron beam in a defect-review SEM in accordance with the present invention.
Figure 18:
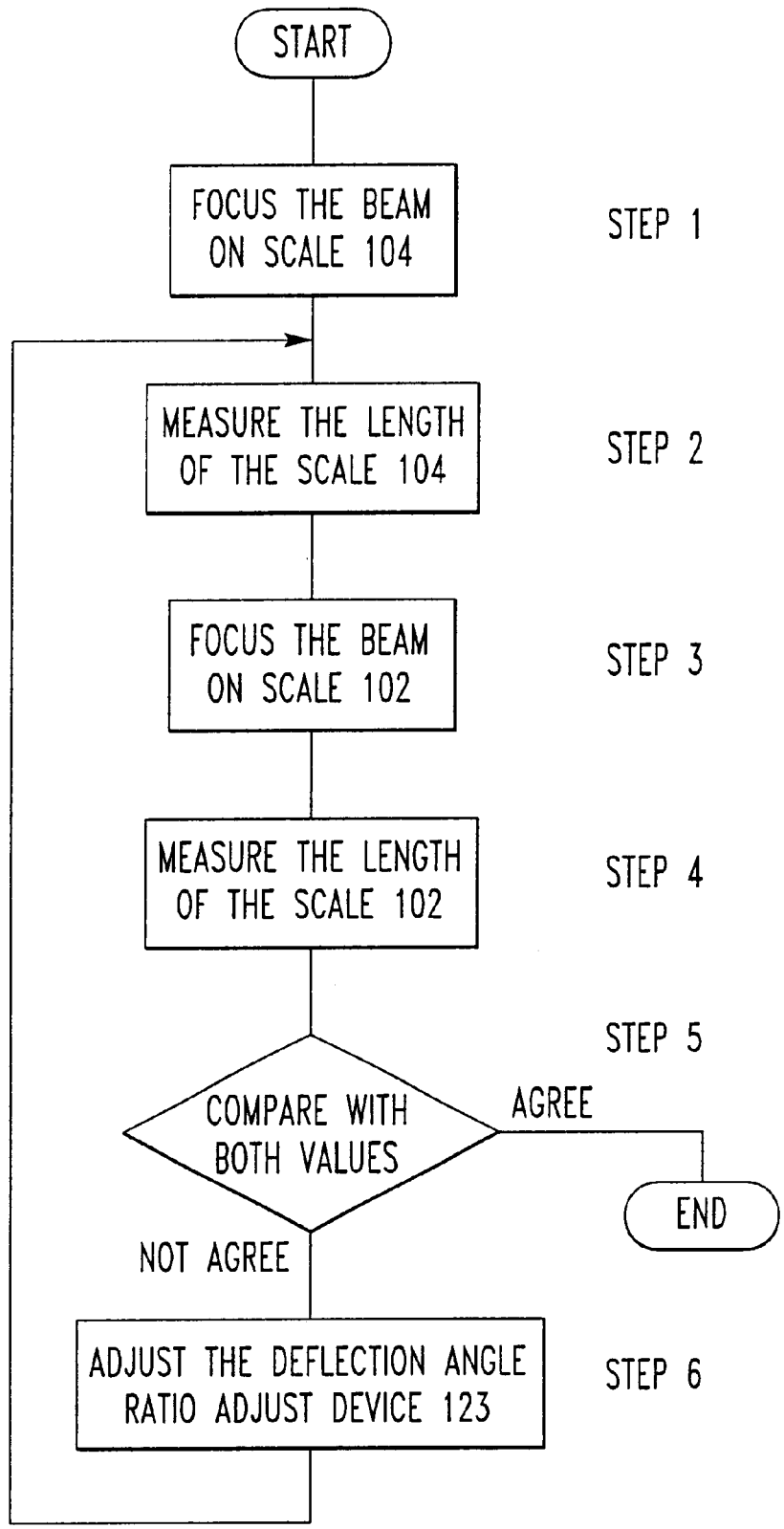
FIG. 18 is a flowchart illustrating a procedure for operations for adjustment of a vertical scan of the electron beam in a defect-review SEM in accordance with the invention.
Figure 19:
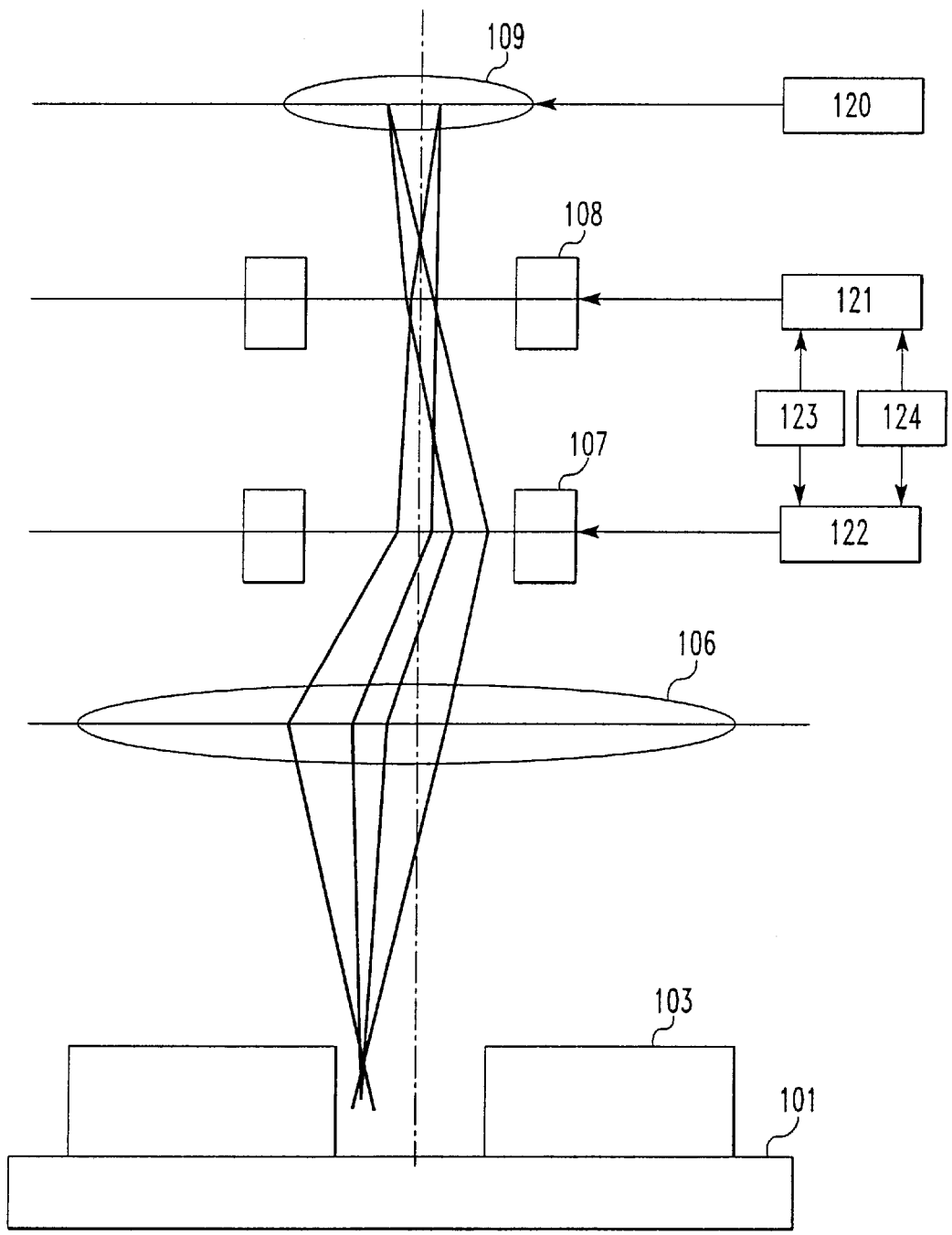
FIG. 19 is a diagram illustrating a method of verifying the convergence angle of the electron beam in a defect-review SEM in accordance with the present invention and a method of adjusting the angle.
Figure 20:
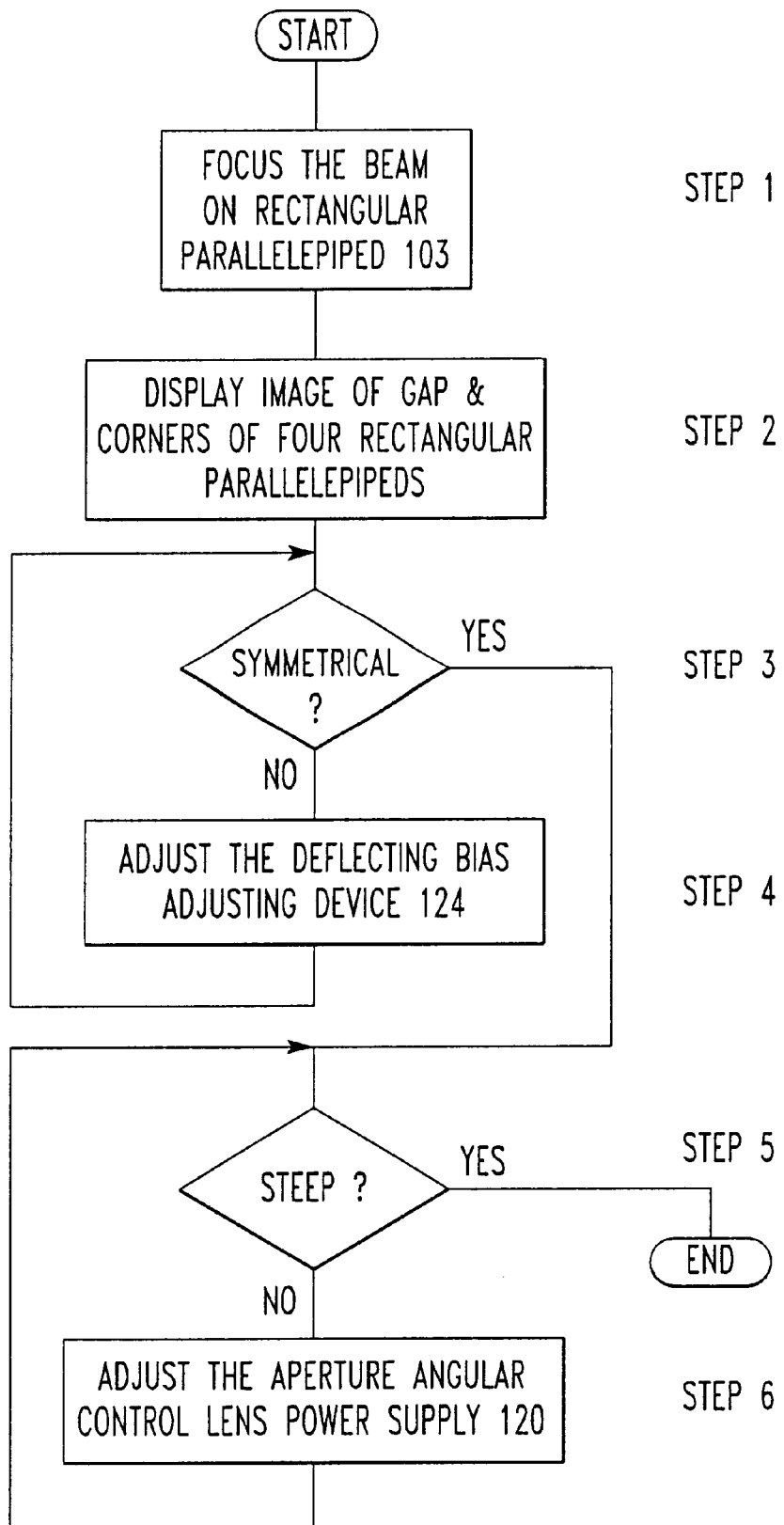
FIG. 20 is a flowchart illustrating a sequence of operations of the method for adjusting the convergence angle as illustrated in FIG. 19.
Figure 22:
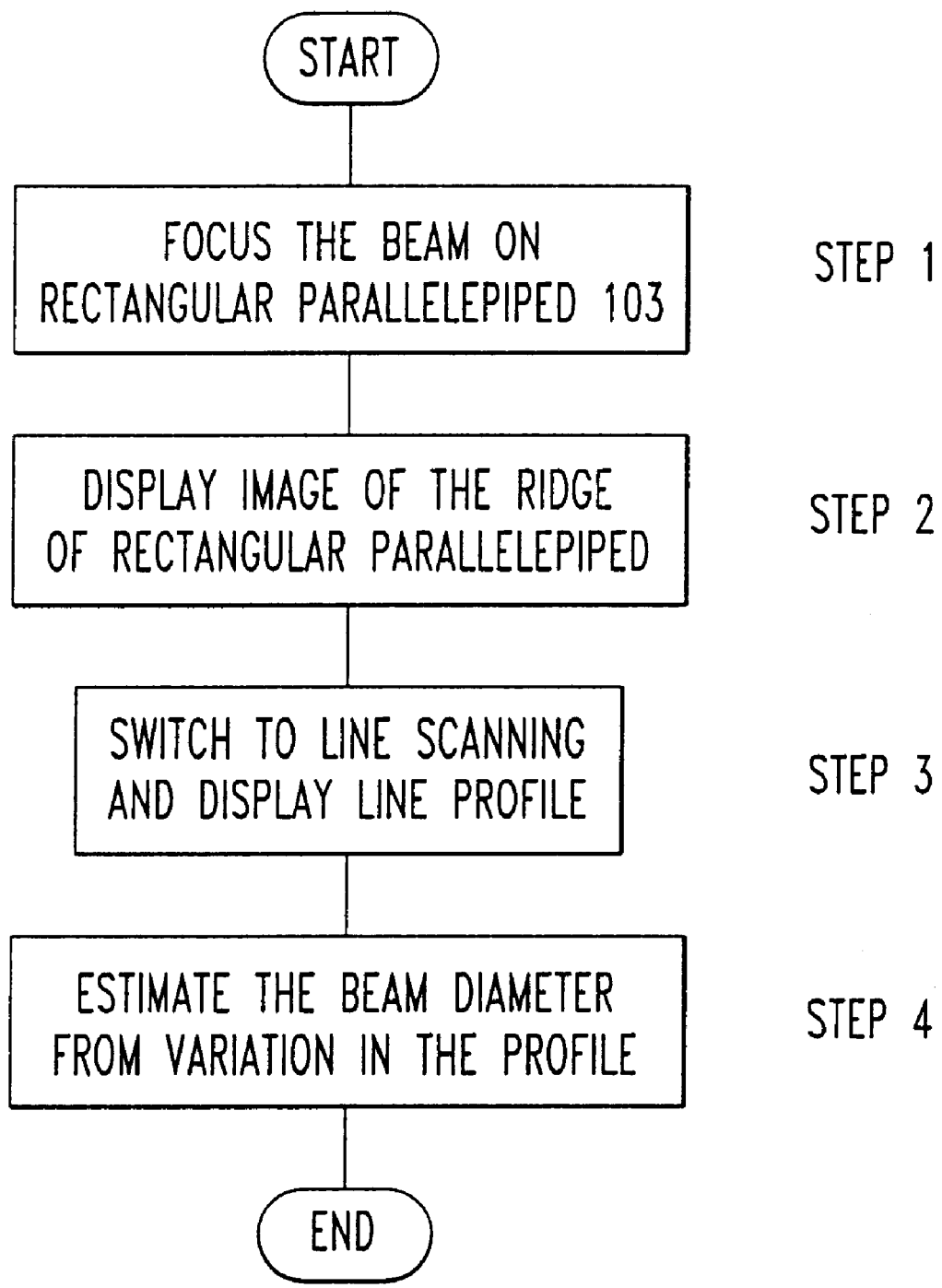
FIG. 22 is a flowchart illustrating a procedure for a sequence of operations for verifying the diameter of the electron beam in a defect-review SEM in accordance with the present invention.
Figure 23A:
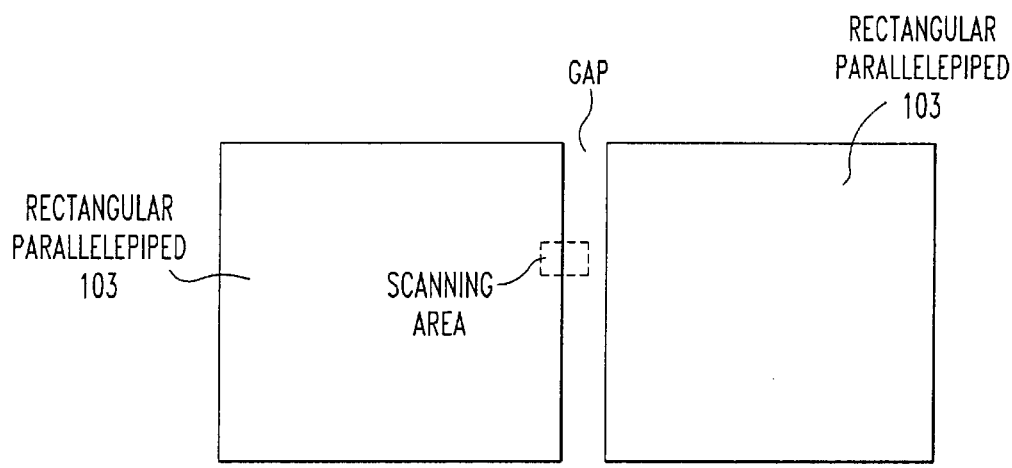
FIGS. 23(A–C) are diagrams illustrating a scanned image obtained when the diameter of the electron beam in a defect-review SEM in accordance with the present invention is verified.
Figure 23B:
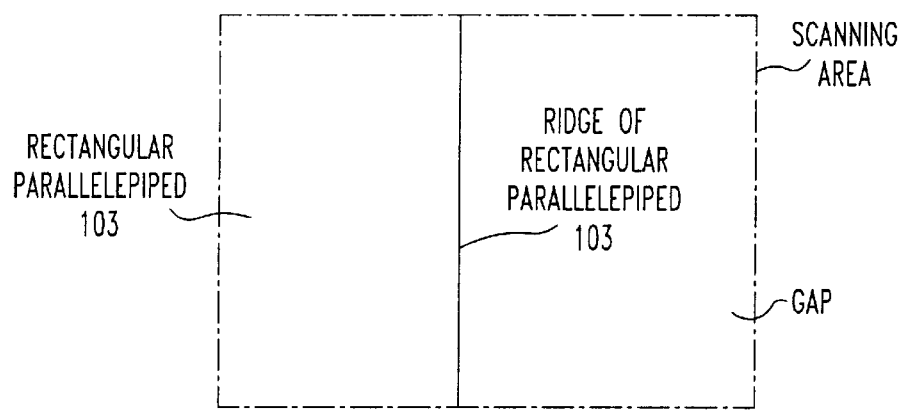
Figure 23C:
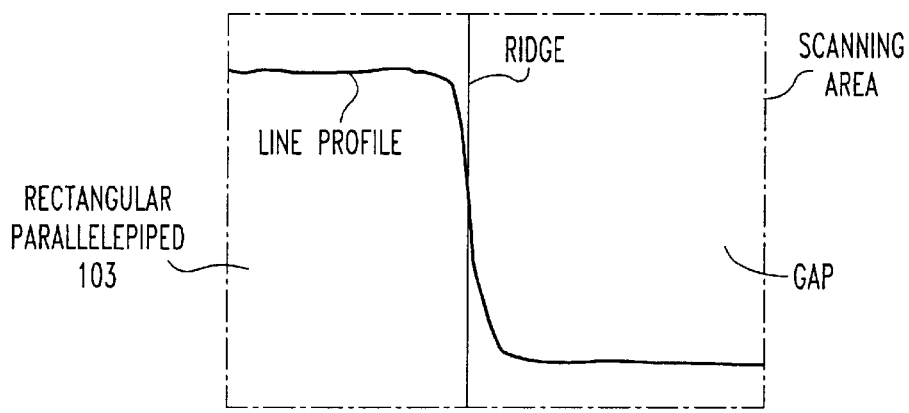

Verification and adjustment using the reference sample 114 described above are described below in turn. FIG. 17 illustrates a method of checking vertical scanning of an electron beam, as well as a method of adjusting it. FIG. 18 is a flowchart illustrating a sequence of operations for adjusting parallel scanning of the electron beam. FIG. 19 is a diagram illustrating a method of checking the convergence angle of the electron beam, as well as a method of adjusting the angle. FIG. 20 is a flowchart illustrating a procedure for adjusting the degree of verticalness. FIG. 21 is a diagram illustrating a scanned image when the degree of verticalness of the electron beam is adjusted. FIG. 22 is a flowchart illustrating a method of checking the diameter of the electron beam. FIG. 23 is a diagram illustrating a scanned image when the diameter of the electron beam is examined.

Referring to FIG. 17, an electron beam enters an upper-stage deflector 108, which in turn deflects the beam through an angle $\theta_{upper}$. The beam enters the lower-stage deflector 107, which in turn deflects the beam in the opposite direction through an angle $\theta_{lower}$. Therefore, the beam impinges on the objective lens 106 at an angle $\theta=\theta_{upper}+\theta_{lower}$. If the angle $\theta_{upper}$ is positive, the angle $\theta_{lower}$ is negative. If the electron beam is subsequently deflected in the opposite direction through the angle $\theta$ by the action of the objective lens 106, the electron beam is made vertical. Under this condition, the intersection of the center axis of the electron optics and the electron beam is coincident with the back focal point of the objective lens 106 and stationary during scan. Accordingly, the angle $\theta=\theta_{upper}+\theta_{lower}$ formed by the upper-stage deflector 108 and the lower-stage deflector 107 is so adjusted as to agree with the deflection angle owing to the action of the objective lens 106. This adjustment is made by the aligning functions of the deflectors 108 and 107. The deflection angle $\theta_{upper}$ of the upper-stage deflector 108 and the deflection angle $\theta_{lower}$ of the lower-stage deflector 107 are not independently adjusted. Rather, a deflection angle ratio adjusting device 123 capable of adjusting the ratio $\theta_{lower}/\theta_{upper}$ of the deflection angles and a deflecting bias adjusting device 124 are attached to each of an upper-stage deflector power supply 121 and a lower-stage deflector power supply 122. The deflecting bias adjusting device 124 can adjust a bias voltage applied to at least one of the deflectors 108 and 107. The point that is stationary during scan can be moved toward the center axis of the electron optics by adjusting the deflection angle ratio $\theta_{lower}/\theta_{upper}$. Furthermore, this stationary point can be moved within the plane vertical to the center axis of the electron optics by adjusting the bias voltages applied to at least one of the deflectors 108 and 107.

A method of adjusting the parallel scan of the electron beam is now described by referring to the flowchart of FIG. 18. In step 1, the electron beam is scanned in two dimensions in the X- and Y-axes using the upper-stage deflector 108 and the lower-stage deflector 107 to display a scanned image on a CRT (not shown). The sample stage is driven to bring the scale 104 of the reference sample 114 under the electron beam. The beam is focused onto the scale 104 using the objective lens 106.

In step 2, the length of each division of the scale 104 (e.g., the pitch between mesh lines) in the X-direction and the length of each division of the scale in the Y-direction are recorded on the CRT.

In step 3, the sample stage is driven to bring the scale 102 of the reference sample 114 under the electron beam. The beam is focused onto the scale 102 using the objective lens 106.

In step 4, the length of each division of the scale 102 in the X-direction and the length of each division of the scale in the Y-direction are recorded on the CRT.

In step 5, a decision is made as to whether the length of each division of the scale 104 in the X-direction recorded on the CRT in step 1 agrees with the length of each division of the scale 102 recorded on the CRT in step 2. Similarly, a decision is made as to whether the length of each division of the scale 104 in the Y-direction recorded on the CRT in step 1 agrees with the length of each division of the scale 102 in the Y-direction recorded on the CRT in step 2. If they agree (i.e., the result of the decision made in step 5 is YES), this adjustment for parallel scan is completed.

In step 6, if there is at least one disagreement, the deflecting voltage is finely adjusted by the aligning functions, deflection angle ratio adjusting device 123 of the upper-stage deflector 108 and the lower-stage deflector 107 to adjust the deflection angle ratio $\theta_{lower}/\theta_{upper}$. Control then goes back to step 2.

In FIG. 19, an electron beam orbit indicated by the thin line shows a case in which the beam has a large convergence angle. An electron beam orbit indicated by the solid line indicates a case in which the beam has a small convergence angle. The convergence angle of the electron beam is adjusted by the angular aperture control lens 109 via an angular aperture control lens power supply 120. The beam is deflected through a given angle by the upper-stage deflector 108 and the lower-stage deflector 107. The beam is focused by the objective lens 106 and hits the sample at a given convergence angle. At this time, if the convergence angle of the electron beam is sufficiently small and hits the sample vertically, the beam impinging on the substrate 101 can reach the top surface of the substrate 101 without falling on the side surface of the rectangular parallelepiped 103.

A method of adjusting the degree of verticalness of the electron beam is now described by referring to FIGS. 19, 20, and 21. In step 1 of FIG. 20, the electron beam is 35 scanned in two dimensions in the X- and Y-directions using the upper-stage deflector 108 and the lower-stage deflector 107 to display a scanned image on the CRT. The sample stage is driven to bring one of rectangular parallelepipeds 103 of the reference sample 114 under the electron beam.. The focus of the electron beam is brought to the top surface of the rectangular parallelepiped 103 using the objective lens 106.

Figure 21A:
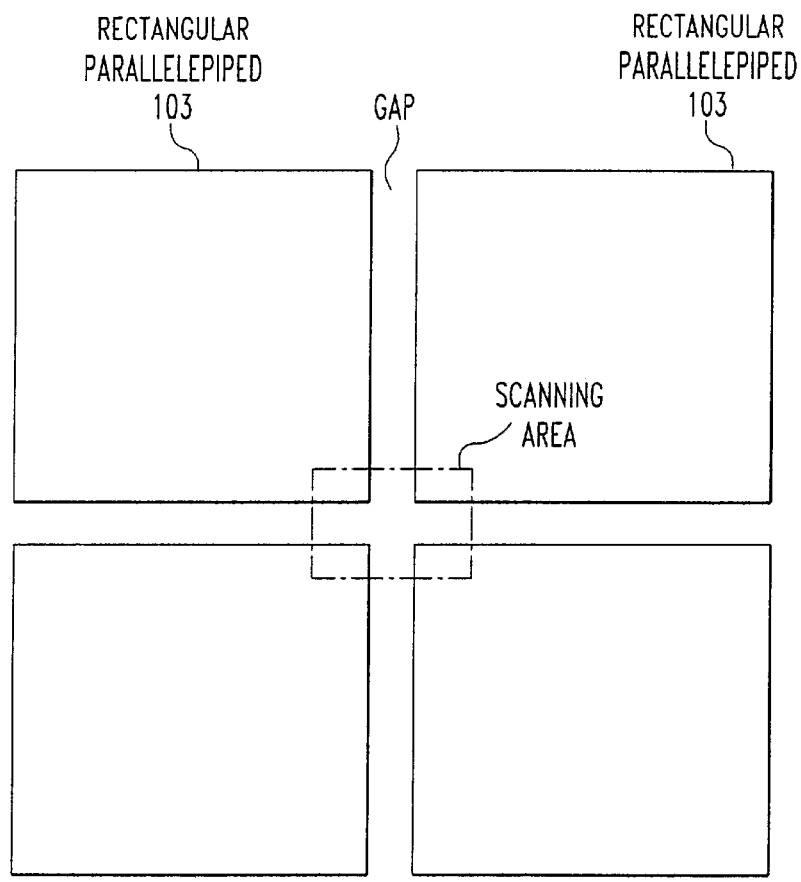
FIGS. 21(A–D) are diagrams illustrating a scanned image obtained when the convergence angle of the electron beam in a defect-review SEM in accordance with the present invention is adjusted.
Figure 21B:
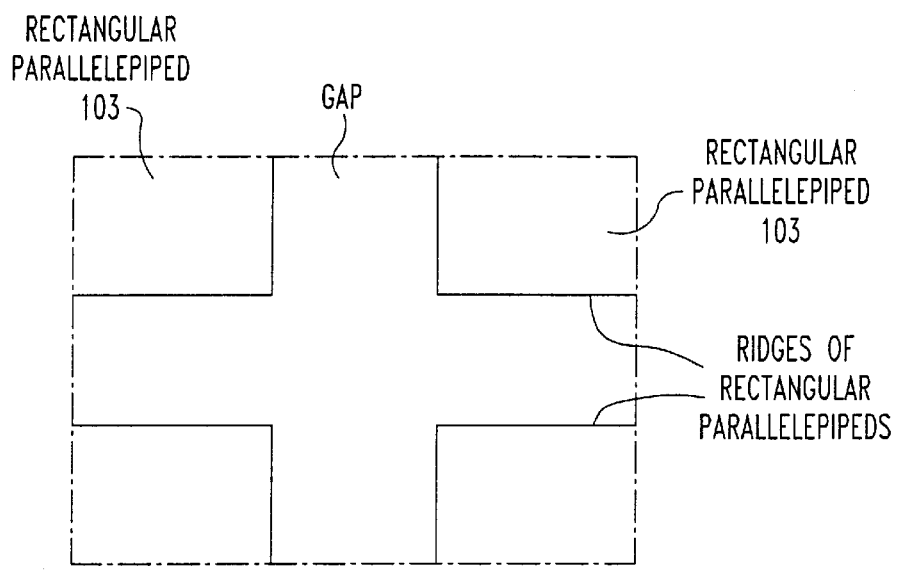
Figure 21C:
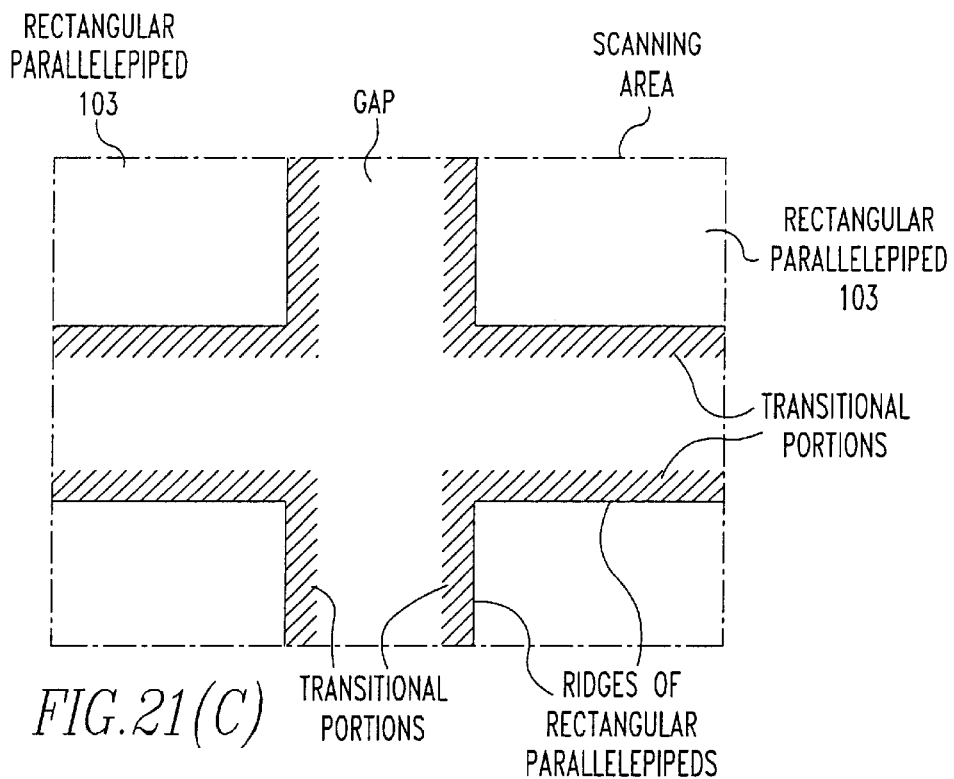
Figure 21D:
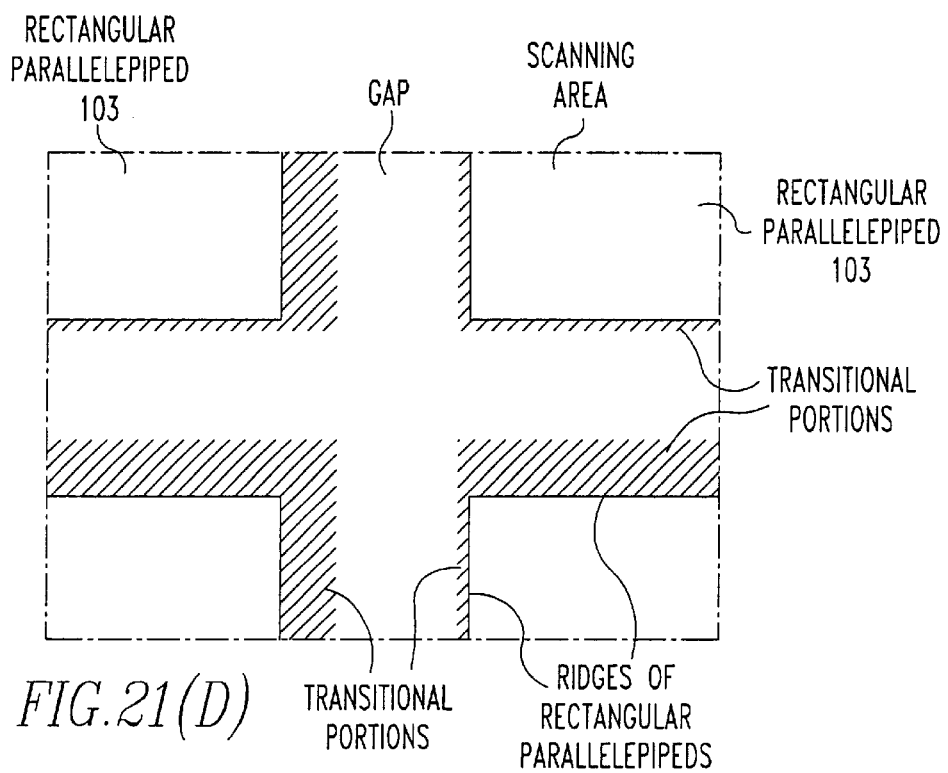

In step 2, the sample stage is driven to display on the CRT a scanned image of the corners of the four rectangular parallelepipeds 103 adjacent to each other in the X- and Y-directions and of the gap among them, as shown in FIG. 21(A). On this scanned image, the images of the corners of the top surface of the four rectangular parallelepipeds 103 and the image of the gap, or the image of the top surface of the substrate 101, should be seen to be adjacent to each other about the ridges of the rectangular parallelepipeds 103, as shown in FIG. 21(B). However, if the convergence angle of the electron beam 105 is large or oblique incidence occurs, a part of the beam will hit the vertical planes of the rectangular parallelepipeds 103 in spite of the fact that one tries to cause the electron beam to fall on the gap close to the ridges of the rectangular parallelepipeds 103, or the top surface of the substrate 101. Therefore, as shown in FIG. 21(C) or FIG. 21(D), transitional portions are formed from the ridges of the rectangular parallelepipeds 103 to the gap. Where the electron beam achieves vertical incidence, if the convergence angle is large, symmetrical transitional portions appear, as shown in FIG. 21(C). If the electron beam does not achieve vertical incidence, transitional portions that are not symmetrical and different in width are produced, as shown in FIG. 21(D).

In step 3, if the transitional portions from the ridges of the rectangular parallelepipeds 103 to the gap on the scanned image are sufficiently symmetrical both vertically and horizontally, i.e., if they are seen as shown in FIG. 21(C) or FIG. 21(B), the adjustment of the degree of verticalness for the scan is completed. Control then jumps to step 5. Otherwise, i.e., if a state as shown in FIG. 21(D) occurs, control proceeds to the next step.

In step 4, if a state as shown in FIG. 21(D) takes place, the deflecting voltage is finely adjusted using the aligning functions, the deflecting bias adjusting device 124 of the upper-stage deflector 108 and the lower-stage deflector 107 for adjusting the bias voltage. Control then goes back to step 3.

In step 5, if the transitional portions from the ridges of the rectangular parallelepipeds 103 to the gap on the scanned image are sufficiently steep both vertically and horizontally, i.e., if the state shown in FIG. 21(B) is observed, the adjustment of the convergence angle is completed. All the adjustments of the degree of verticalness including the degree of verticalness for the scan are completed. Otherwise, i.e., if the state shown in FIG. 21(C) is observed, control proceeds to the next step.

In step 6, if the state shown in FIG. 21(C) is seen, the angular aperture control lens power supply 120 is operated to vary the convergence angle of the angular aperture control lens 109. Control then goes back to step 5.

A method of checking the diameter of the electron beam is described by referring to FIGS. 22 and 23. In step 1 of the flowchart of FIG. 22, the electron beam is scanned in two dimensions in the X- and Y-directions using the upper-stage deflector 108 and the lower-stage deflector 107 to display a scanned image on the CRT. The sample stage is driven to bring one of the rectangular parallelepipeds 103 of the reference sample 114 under the electron beam. The focus of the beam is brought onto the rectangular parallelepipeds 103 using the objective lens 106. At this time, the astigmatism of the beam is sufficiently compensated using an astigmatic corrector (not shown).

In step 2, the sample stage is driven to bring the ridges of the rectangular parallelepipeds 103 parallel to the Y- or X-direction into the vicinity of the center of the scanned image on the CRT.

In step 3, the scanning of the upper-stage deflector 108 and the lower-stage deflector 107 is switched to line scanning in the X- or Y-direction to display a line profile on the CRT.

In step 4, the diameter of the electron beam 105 in the X- or Y-direction is found from a variation in the line profile at the ridges of the rectangular parallelepipeds 103 parallel to the Y- or X-direction.

In the description provided above, four rectangular parallelepipeds are used as reference samples. It is more desirable to use a sheet having a thickness of about 0.5 to 0.7 mm and provided with holes having a diameter of approximately 0.1 to 0.2 mm and vertical inner walls. Instead of the rectangular parallelepipeds, two sheets each having at least one vertical side surface may be used. Their vertical surfaces are made to face each other to form a gap between them. A similar pair of sheets is also prepared. These sheets are placed on the substrate such that the gaps are oriented vertical to each other.

As described thus far in the present invention, the convergence angle of an electron beam directed to a sample is made very small by an angular aperture control lens. The beam is scanned across the sample while vertical incidence on the sample is maintained by an upper-stage deflector and a lower-stage deflector. Secondary electrons or backscattered electrons emitted from the sample are detected by a detector.

Consequently, charging on the side surface of each contact hole can be reduced greatly. Therefore, good contrast can be obtained from the film residues at the bottom of the contact hole if it has a small diameter and a high aspect ratio. In the prior art technique, this has been difficult to achieve. Hence, openings in contact holes can be inspected precisely. For example, where a contact hole has an opening diameter of less than 0.1 $\mu$m and an aspect ratio of 10 to 15, the opening can be inspected. The present invention can be applied with similar utility to inspection of plugged contact holes and to inspection of voltage contrast of defective metallization patterns.

In the past, contrast around the edges of contact holes has been large. This has urged to increase the number of pixels, deteriorating the overall throughput of the inspection. In accordance with the present invention, contrast of edges is reduced and so the number of pixels can be decreased. In consequence, the throughput of the inspection can be improved by a factor of 2 or more compared with the prior art technique.

The dose (nQ/pixel) of the electron beam to the sample assumes a large value of $1.5 \times 10^{-6}$ where the prior art conic electron beam is used. On the other hand, in the present invention, contrast of the image of a sample (especially, a contact hole) is improved greatly by collimating the beam. Experiment has revealed that the dose of the electron beam to the sample can be reduced to about $7.5 \times 10^{-8}$, i.e., reduced by a factor of 20 or more. This is effective in reducing charging on the wafer sample. Furthermore, the electron beam damage to the sample can be reduced greatly.

In addition, the convergence angle of the electron beam is set to a small value of $10^{-5}$ to $10^{-6}$ rad, for example. Therefore, the depth of focus is in excess of 100 $\mu$m. As a result, if the wafer sample has a large diameter of 8 to 12 inches and suffers from warpage (by more than 100 $\mu$m in accordance with the SEMI standards), or if the patterning process results in wafer surface unevenness, the whole wafer surface can be inspected in a focused state by focusing the electron beam at one location on the sample. Since recently used conic electron beams have large convergence angles, the amount of defocus permitted is about ±0.5 $\mu$m. That is, the depth of focus is about 1 $\mu$m. Since the wafer sample has warpage or surface unevenness, focusing must be done at various locations on the same sample.

If a defect is found during observation, a wide area around it can be immediately scanned without moving the stage because it is possible to switch between high-speed, widearea line scanning (one-dimensional scan) of 4096 pixels per line and X-Y scanning (two-dimensional scan).

The convergence angle of the electron beam impinging on the sample can be controlled from a large angle to a small angle by an angular aperture control lens. In the observation mode, the lens is switched to a large value. In the inspection mode, the lens is switched to a small value. Consequently, the same instrument can inspect microscopic foreign matter and observe morphologies of sample surfaces by making use of a conic electron beam. Furthermore, the instrument inspects contact holes and metallization patterns for defects by reducing the convergence angle.

Secondary electrons or backscattered electrons emanating from the sample can be detected by a detector located behind the objective lens. This enables the secondary electrons or backscattered electrons from the sample to be detected by the detector efficiently.

In another feature of the present invention, an electric field control lens is mounted between the sample and the objective lens. The voltage between the sample and the electric field control lens can be varied in the range from 0 to ±1 kV. Therefore, charging of the opening in the contact hole can be suppressed.

In a method of inspecting contact holes in accordance with the present invention, an electron beam with a convergence angle of $10^{-5}$ to $10^{-6}$ rad is directed to a sample having numerous contact holes. The beam is scanned in two dimensions while maintaining the vertical incidence on the sample. This induces secondary electrons or backscattered electrons, which are detected by a doughnut-like detector located behind the objective lens on the optical axis of the electron beam. Accordingly, this inspection method yields the same advantages as the inventive defect-review SEM already described.

The reference sample and method for adjusting vertical incidence of the electron beam used in a defect-review SEM in accordance with the present invention and for adjusting the convergence angle of the beam use a reference sample having holes or grooves having vertical inner walls and scales positioned at different heights. Adjustments are made using this reference sample.

Additionally, a method of adjusting the convergence angle of the electron beam and the vertical incidence in accordance with the present invention uses a reference sample comprising four rectangular parallelepipeds and scales located at different heights. The four parallelepipeds are arranged in two rows and two columns in a two-dimensional manner and regularly spaced from each other. Using this reference sample, adjustments are made.

Thus, it is easy to prepare the reference sample. Moreover, the method of adjusting the convergence angle of the electron beam and the vertical incidence in a defect-review SEM in accordance with the present invention can be practiced reliably and easily.

Having thus described my invention with the detail and particularity required by the Patent Laws, what is desired protected by Letters Patent is set forth in the following claims.

What is claimed is:

1. A defect-review SEM comprising:
   an electron gun for producing an electron beam;
   an objective lens for focusing said electron beam onto a sample to be inspected such that said beam hits said sample at a convergence angle to thereby produce electrons wherein the convergence angle of said electron beam hitting said sample is $10^{-5}$ to $10^{-6}$ rad;
   an upper-stage deflector and a lower-stage deflector for scanning said electron beam across said sample in two dimensions while maintaining vertical incidence of said electron beam on said sample;
   a lens for controlling the convergence angle of said electron beam hitting said sample; and
   a detector for detecting said electrons.

2. The defect-review SEM of claim 1, wherein said lens for controlling the convergence angle of said electron beam hitting said sample switches said convergence angle between a large value in an observation mode and a small value in an inspection mode.

3. A defect-review SEM comprising:
   an electron gun for producing an electron beam;
   an objective lens for focusing said electron beam onto a sample to be inspected such that said beam hits said sample at a convergence angle to thereby produce electrons wherein said convergence angle is $10^{-2}$ to $10^{-3}$ rad in the observation mode and $10^{-5}$ to $10^{-6}$ rad in the inspection mode;
   an upper-stage deflector and a lower-stage deflector for scanning said electron beam across said sample in two dimensions while maintaining vertical incidence of said electron beam on said sample;
   a lens for controlling the convergence angle of said electron beam hitting said sample; and
   a detector for detecting said electrons.

4. The defect-review SEM of claim 1 or claim 3, wherein a mechanism for varying the ratio of deflection angle of said upper-stage deflector to deflection angle of said lower-stage deflector and a mechanism for applying a bias to at least one of said upper-stage and lower-stage deflectors are included in or connected to said upper-stage and lower-stage deflectors.

5. A defect-review SEM comprising:
   an electron gun for producing an electron beam having an optical axis;
   an objective lens for focusing said electron beam onto a sample to be inspected such that said beam hits said sample at a convergence angle to thereby produce electrons wherein the convergence angle of said electron beam hitting said sample is $10^{-5}$ to $10^{-6}$ rad;
   an upper-stage deflector and a lower-stage deflector for scanning said electron beam across said sample in two dimensions while maintaining vertical incidence of said electron beam on said sample;
   a lens for controlling the convergence angle of said electron beam hitting said sample; and
   a doughnut-like detector for detecting said electrons, said detector being located behind said objective lens on the optical axis of said electron beam.

6. The defect-review SEM of claim 5, wherein an electric field control lens is located between said sample and said objective lens, and wherein a voltage capable of being varied from 0 to ±1 kV is applied between said sample and said electric field control lens.

7. The defect-review SEM of claim 5, wherein said lens for controlling the convergence angle of said electron beam hitting said sample switches said convergence angle between a large value in an observation mode and a small value in an inspection mode.

8. The defect-review SEM of claim 5, wherein said convergence angle is $10^{-2}$ to $10^{-3}$ rad in the observation mode and $10^{-5}$ to $10^{-6}$ rad in the inspection mode.

9. The defect-review SEM of claim 5 or claim 8, wherein a mechanism for varying the ratio of deflection angle of said upper-stage deflector to deflection angle of said lower-stage deflector and a mechanism for applying a bias to at least one of said upper-stage and lower-stage deflectors are included in or connected to said upper-stage and lower-stage deflectors.

10. A method of inspecting numerous contact holes formed in a sample, said method comprising the steps of:
    directing an electron beam having an optical axis to said sample such that said beam hits said sample at a convergence angle of $10^{-5}$ to $10^{-6}$ rad;
    scanning said electron beam in two dimensions while maintaining vertical incidence of said beam on said sample to thereby produce electrons; and
    detecting said electrons by a doughnut-like detector located behind an objective lens on the optical axis of said electron beam.

11. An adjusting reference sample used for adjustment of a defect-review SEM having an electron gun for producing an electron beam, an objective lens for focusing said electron beam onto a sample to be inspected such that said beam hits said sample vertically at a convergence angle to thereby produce electrons, an upper-stage deflector and a lower-stage deflector for scanning said electron beam across said sample to be investigated in two dimensions while maintaining vertical incidence of said electron beam on said sample to be investigated, a lens for controlling the convergence angle of said electron beam hitting said sample, and a detector for detecting the electrons, said adjusting reference sample being used for an adjustment such that said electron beam scans parallel, said adjusting reference sample being used for an adjustment such that said electron beam hits said sample vertically, said adjusting reference sample being used for adjustment of the convergence angle, said adjusting reference sample comprising:
    four rectangular parallelepipeds having vertical side surfaces and arranged in two rows and two columns at regular intervals therebetween in a two-dimensional manner wherein said four rectangular parallelepipeds having vertical side surfaces have been cut from a (100) single crystal of Si or GaAs, and wherein each of scales consists of a piece of mesh of Ni or a grating; and
    scales located at different heights.

12. The adjusting reference sample of claim 11, wherein:
(A) each of said four rectangular parallelepipeds has a thickness of about 0.6 to 0.7 mm and is about 10 mm in square;
(B) said four rectangular parallelepipeds are spaced from each other by 0.1 to 0.2 mm;
(C) said piece of mesh is of 25 to 100 μm mesh;
(D) one of the heights of said scales is flush with top surfaces of said rectangular parallelepipeds; and
(E) another of said heights of said scales is flush with bottom surfaces of said rectangular parallelepipeds.

13. A method for adjustment of a defect-review SEM having an electron gun for producing an electron beam, an objective lens for focusing said electron beam onto a sample to be investigated such that said beam hits said sample at a convergence angle to thereby produce electrons, an upper-stage deflector and a lower-stage deflector for scanning said electron beam across said sample in two dimensions while maintaining vertical incidence of said electron beam onto said sample, a lens for controlling the convergence angle of said electron beam hitting said sample, and a detector for detecting said electrons, said method comprising the steps of:

mounting scales at different heights;

measuring divisions of said scales by scanning said electron beam;

comparing measured values derived from the scales at different heights; and varying the ratio of deflection angle of said upper-stage deflector to the deflection angle of said lower-stage deflector if the compared values are not coincident with each other, until they agree, whereby said electron beam scans parallel.

14. A method for adjustments of a defect-review SEM having an electron gun for producing an electron beam, an objective lens for focusing said electron beam onto a sample to be investigated such that said beam hits said sample at a convergence angle to thereby produce electrons, an upper-stage deflector and a lower-stage deflector for scanning said electron beam across said sample in two dimensions while maintaining vertical incidence of said electron beam on said sample, a lens for controlling the convergence angle of said electron beam hitting said sample, and a detector for detecting said electrons, said method comprising the steps of:

mounting scales at different heights;

measuring divisions of said scales by scanning said electron beam;

comparing measured values derived from said scales at different heights;

varying the ratio of deflection angle of said upper-stage deflector to deflection angle of said lower-stage deflector if the compared values are not coincident with each other, until they agree, whereby said electron beam scans parallel;

arranging four rectangular parallelepipeds having vertical side surfaces as reference samples in two rows and two columns at regular intervals therebetween in a two-dimensional manner;

scanning said electron beam;

determining the presence or absence of effects of the vertical side surfaces and measuring degree of the effects if they exist;

adjusting the value of a bias applied to at least one of said upper-stage and lower-stage deflectors, if the degree of effects differs according to direction within the plane of the surface of said sample, to make the degree of effects uniform among directions, thereby achieving vertical incidence of said electron beam on said sample; and varying said convergence angle by adjusting the lens for controlling said convergence angle if the effects are present.

15. The method of claim 14, wherein an adjustment for causing said electron beam to scan parallel is made first, an adjustment for causing said electron beam to hit the sample vertically is made next, and said convergence angle is adjusted finally.

16. The method of claim 15, wherein said adjustments are made repeatedly if necessary.

\* \* \* \* \*

UNITED STATES PATENT AND TRADEMARK OFFICE
CERTIFICATE OF CORRECTION

PATENT NO. : 6,426,501 B1
DATED : July 30, 2002
INVENTOR(S) : Seiichi Nakagawa

It is certified that error appears in the above-identified patent and that said Letters Patent is hereby corrected as shown below:

Title page,
Item [73], Assignee, "Jeol Ltd." should read -- JEOL Ltd. --

Column 6,
Line 30, "of to" should read -- of 25 to --.

Column 16,
Line 10, "is 35 scanned" should read -- is scanned --.
Line 15, "beam.. The" should read -- beam. The --.

Signed and Sealed this

Fourteenth Day of January, 2003

JAMES E. ROGAN
*Director of the United States Patent and Trademark Office*